US008946797B2

(12) United States Patent
Mizuta et al.

(10) Patent No.: US 8,946,797 B2
(45) Date of Patent: Feb. 3, 2015

(54) SOLID-STATE IMAGING DEVICE, METHOD OF MANUFACTURING SOLID-STATE IMAGING DEVICE, APPARATUS FOR MANUFACTURING SEMICONDUCTOR DEVICE, METHOD OF MANUFACTURING SEMICONDUCTOR DEVICE, AND ELECTRONIC DEVICE

(71) Applicant: Sony Corporation, Tokyo (JP)

(72) Inventors: Kyohei Mizuta, Kumamoto (JP); Osamu Oka, Kumamoto (JP); Kaoru Koike, Kumamoto (JP); Nobutoshi Fujii, Kanagawa (JP); Hideki Kobayashi, Kumamoto (JP); Hirotaka Yoshioka, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/854,483

(22) Filed: Apr. 1, 2013

(65) Prior Publication Data

US 2013/0256824 A1  Oct. 3, 2013

(30) Foreign Application Priority Data

Apr. 2, 2012 (JP) ................................. 2012-084014
Jun. 14, 2012 (JP) ................................. 2012-135092

(51) Int. Cl.
*H01L 31/062* (2012.01)
*H01L 27/146* (2006.01)

(52) U.S. Cl.
CPC ...... *H01L 27/1464* (2013.01); *H01L 27/14634* (2013.01); *H01L 27/14687* (2013.01); *H01L 27/1469* (2013.01)
USPC .................. 257/292; 257/233; 257/E31.097; 257/E31.121; 257/E27.133; 438/64

(58) Field of Classification Search
CPC ............ H01L 27/1464; H01L 27/1469; H01L 27/14687; H01L 27/14634; H01L 27/307
USPC .......... 257/459, 233, 292, 293, 290, E33.076, 257/E31.058, E31.063, E31.121, E27.133, 257/E25.032; 438/64
See application file for complete search history.

(56) References Cited

U.S. PATENT DOCUMENTS

2004/0266040 A1* 12/2004 Kim et al. ....................... 438/30
2005/0041167 A1*  2/2005 Sugimoto et al. ............... 349/43

(Continued)

FOREIGN PATENT DOCUMENTS

| JP | 02-267951 | 11/1990 |
|---|---|---|
| JP | 05-326353 | 12/1993 |
| JP | 07-066093 | 3/1995 |
| JP | 07-094675 | 4/1995 |
| JP | 2000-348992 | 12/2000 |

(Continued)

*Primary Examiner* — Cuong Q Nguyen
*Assistant Examiner* — Yosef Gebreyesus
(74) *Attorney, Agent, or Firm* — Dentons US LLP

(57) ABSTRACT

There is provided a solid-state imaging device including a sensor substrate having a sensor-side semiconductor layer including a pixel region in which a photoelectric conversion section is provided and a sensor-side wiring layer provided on an opposite surface side from a light receiving surface of the sensor-side semiconductor layer, a circuit substrate having a circuit-side semiconductor layer and a circuit-side wiring layer and provided on a side of the sensor-side wiring layer of the sensor substrate, a connection unit region in which a connection section is provided, the connection section having a first through electrode, a second through electrode, and a connection electrode connecting the first through electrode and the second through electrode, and an insulating layer having a step portion which has the connection electrode embedded therein and has a film thickness that gradually decreases from the connection unit region to the pixel region.

8 Claims, 25 Drawing Sheets

(56) References Cited

U.S. PATENT DOCUMENTS

2010/0288911 A1* 11/2010 Mizuta et al. ............ 250/208.1
2011/0102657 A1*  5/2011 Takahashi et al. ........... 348/308
2011/0233702 A1*  9/2011 Takahashi et al. ........... 257/432
2012/0098081 A1*  4/2012 Horiike et al. ............... 257/443
2012/0248580 A1* 10/2012 Matsugai et al. ............ 257/621

FOREIGN PATENT DOCUMENTS

| JP | 2009-049066 | 3/2009 |
| JP | 2010-135836 | 6/2010 |
| JP | 2010-267675 | 11/2010 |
| JP | 2011-096851 | 5/2011 |
| JP | 2011-205074 | 10/2011 |
| JP | 2012-019209 | 1/2012 |

* cited by examiner

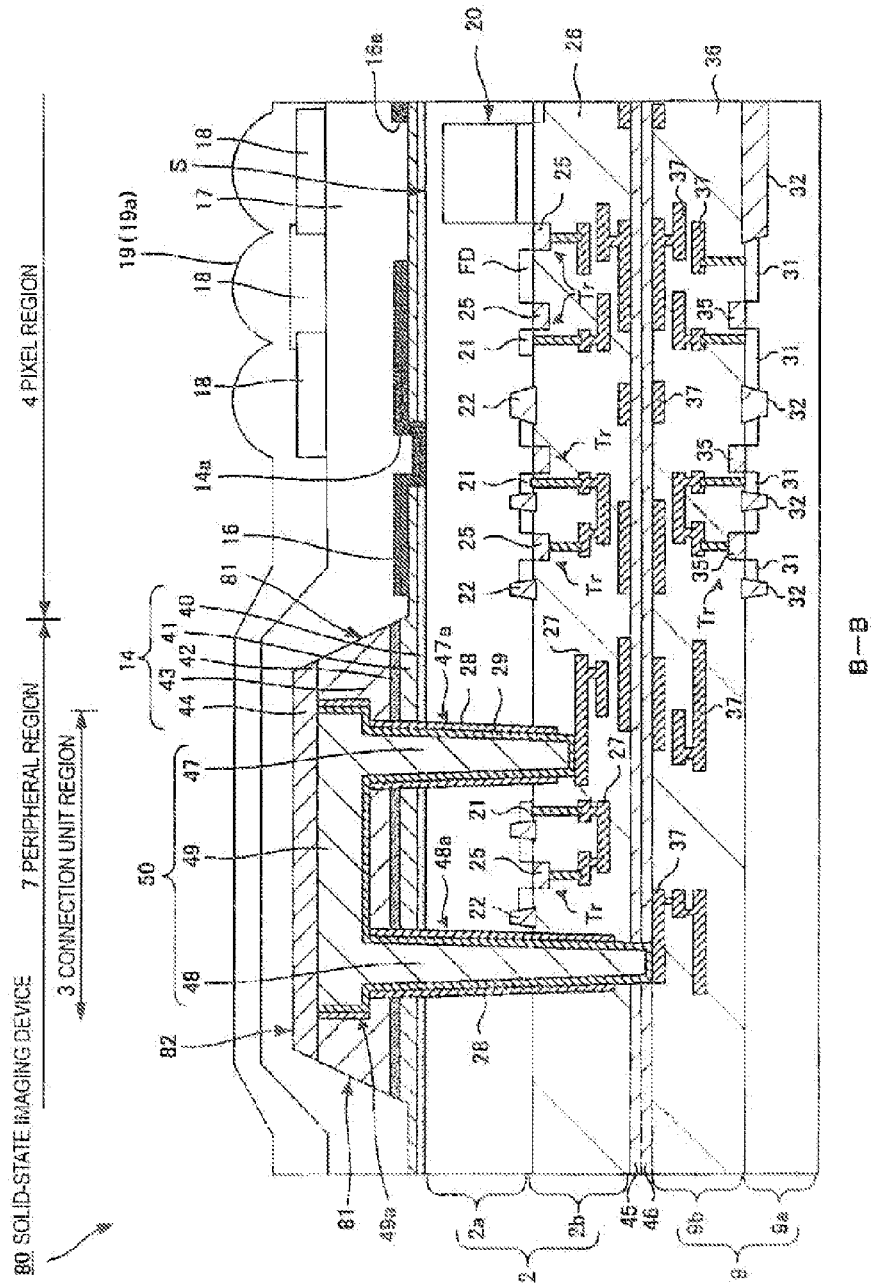

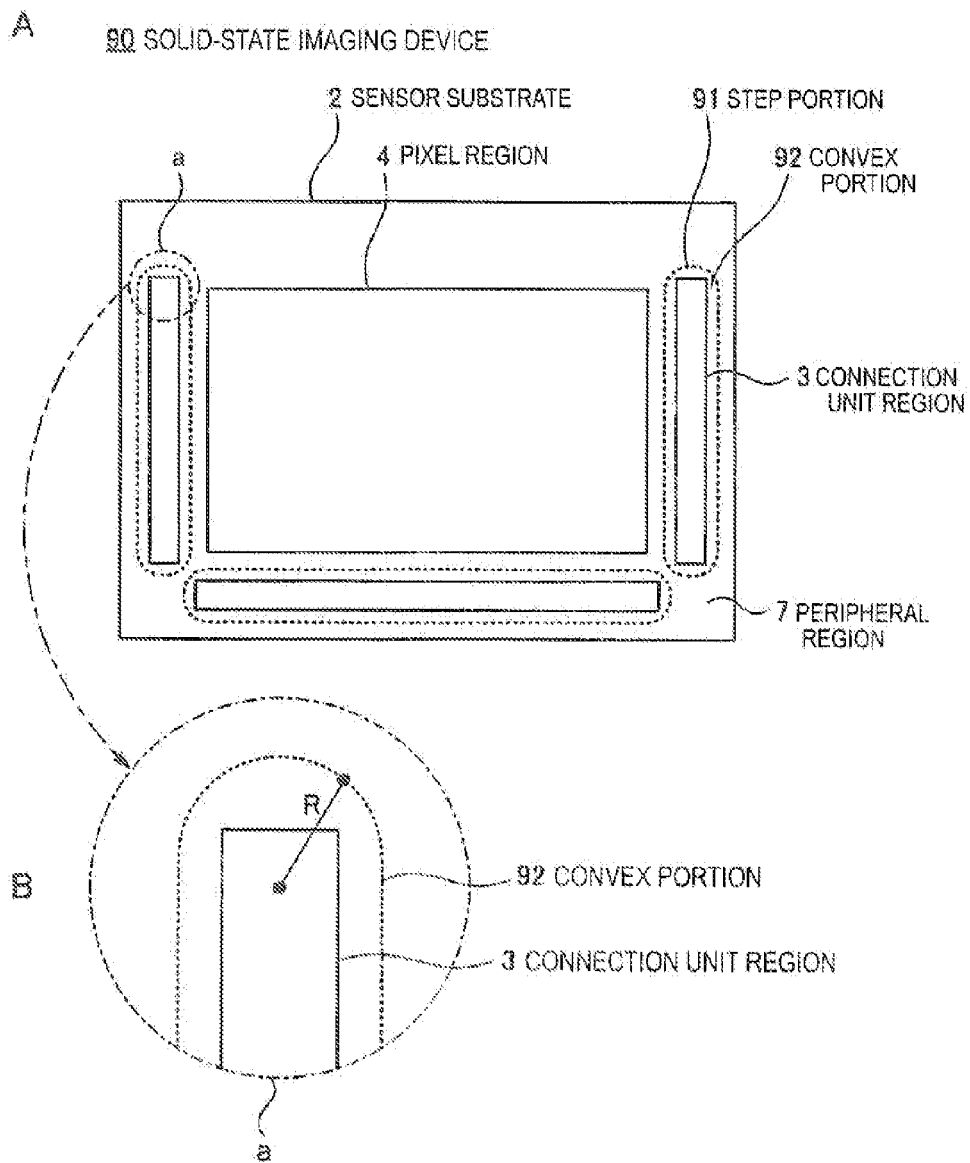

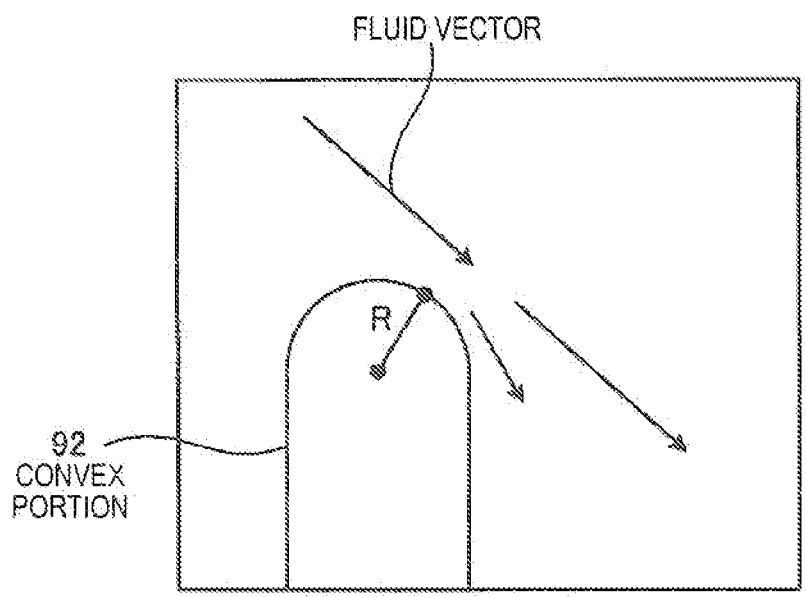
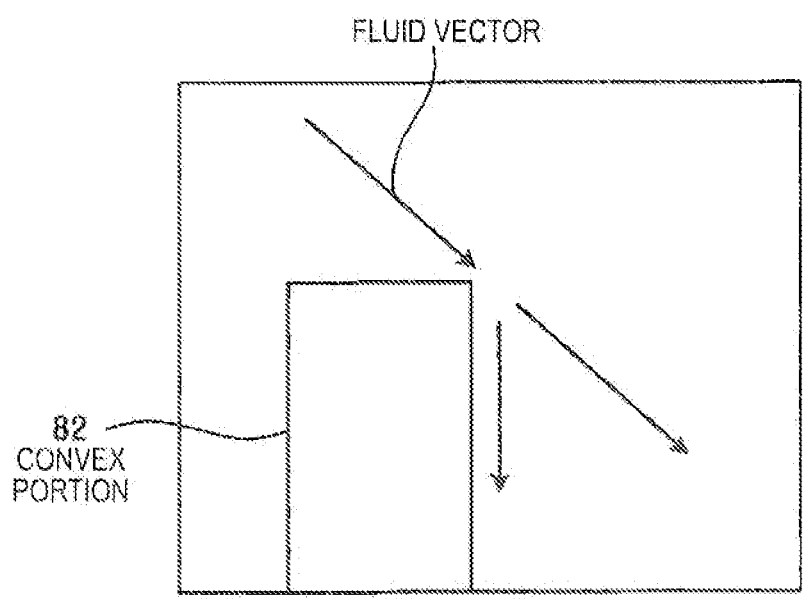

FIG. 29
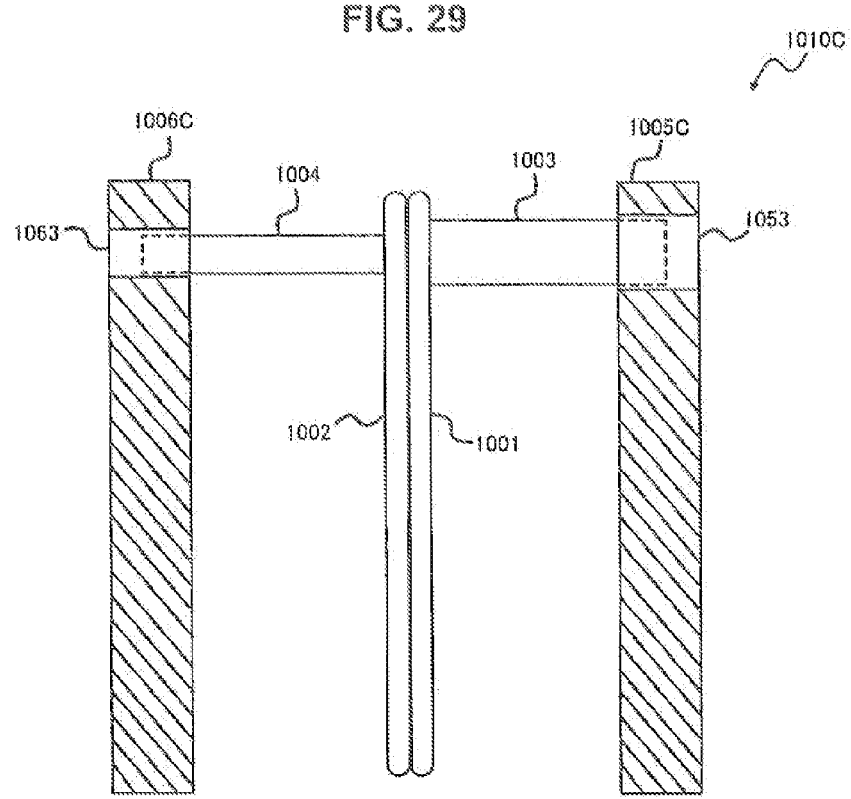
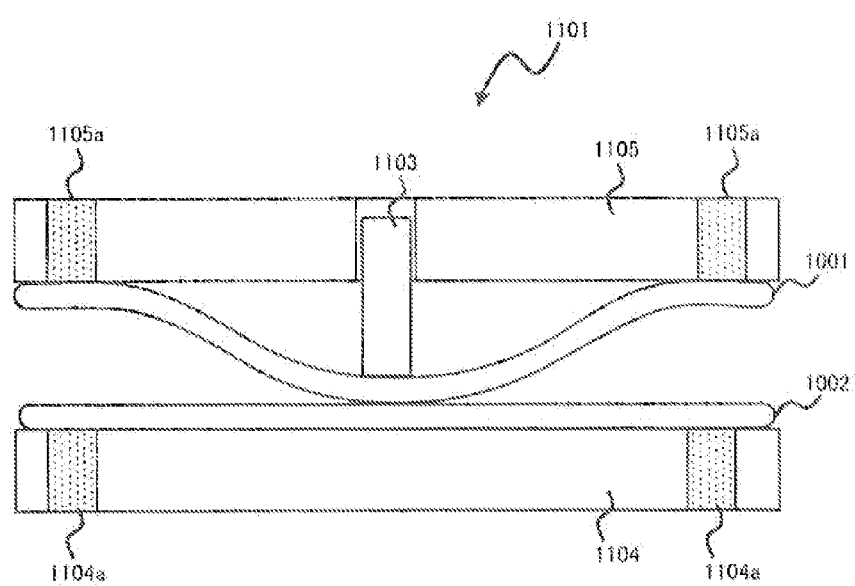

SOLID-STATE IMAGING DEVICE, METHOD OF MANUFACTURING SOLID-STATE IMAGING DEVICE, APPARATUS FOR MANUFACTURING SEMICONDUCTOR DEVICE, METHOD OF MANUFACTURING SEMICONDUCTOR DEVICE, AND ELECTRONIC DEVICE

BACKGROUND

The present technology relates to a solid-state imaging device, a method of manufacturing the solid-state imaging device, an apparatus for manufacturing a semiconductor device, a method of manufacturing the semiconductor device, and an electronic device, and more particularly to a solid-state imaging device in which a driving circuit has been provided on an opposite surface side from a light receiving surface of a semiconductor substrate, a method of manufacturing the solid-state imaging device, an apparatus for manufacturing a semiconductor device and a method of manufacturing the semiconductor device using technology for bonding two substrates, and an electronic device using the solid-state imaging device.

In the related art, technology for shortening a distance between a light incident surface and a light receiving section formed on a substrate in a solid-state imaging device so as to improve sensitivity has been proposed. In Japanese Unexamined Patent Application Publication No. 2010-267675, technology for forming a thickness of a wiring layer on an upper portion of an imaging region to be thinner than a thickness of a wiring layer on an upper portion of a peripheral circuit section formed at the periphery of the imaging region in a front-surface illuminated solid-state imaging device in which a wiring layer is provided on a light incident surface side of a substrate is disclosed. Because the wiring layer on the imaging region is thinner than the wiring layer on the peripheral circuit section in Japanese Unexamined Patent Application Publication No. 2010-267675, a distance from the light incident surface to the light receiving section provided in the imaging region of the substrate is shortened and hence sensitivity is improved.

In addition, recently, a so-called back-surface illuminated solid-state imaging device in which a driving circuit is formed on a back-surface side of a semiconductor substrate and the back-surface side is designated as a light receiving surface so as to improve photoelectric conversion efficiency or sensitivity or increase an opening area of a photodiode has been proposed. Because a wiring layer is provided on a side opposite the light receiving surface of the substrate in the back-surface illuminated solid-state imaging device, a distance between the light receiving section provided on the substrate and an on-chip lens surface provided on the light incident side of the substrate is close and hence sensitivity is improved.

Further, a laminated back-surface illuminated sensor is excellent in terms of cost or image quality (for example, Japanese Unexamined Patent Application Publication No. 2010-245506). For the laminated back-surface illuminated sensor, a back-surface illuminated solid-state imaging device of a three-dimensional (3D) structure in which a circuit substrate on which a driving circuit is formed is provided separately from a semiconductor substrate (sensor substrate) on which a photoelectric conversion section is formed, and the circuit substrate is bonded to a surface on the opposite side of the light receiving surface in the semiconductor substrate has also been proposed (Japanese Unexamined Patent Application Publication No. 2011-096851). In the back-surface illuminated solid-state imaging device with the 3D structure, the 3D structure is configured by connecting the surface of the wiring layer side of the semiconductor substrate to the surface of the wiring layer side of the circuit substrate.

Incidentally, in the above-described solid-state imaging device of the 3D structure, a connection section is provided to electrically connect the semiconductor substrate on which a photoelectric conversion section is formed to the circuit substrate in which the driving circuit is formed. In the connection section, a through hole via passing through the semiconductor substrate and connected to the wiring layer provided on the semiconductor substrate is connected to a through hole via passing through the semiconductor substrate and connected to the wiring layer provided on the circuit substrate through a connection electrode of the connection section on the light receiving surface side of the semiconductor substrate. Further, an insulating film and a passivation film for covering the connection electrode are provided on the light receiving surface side of the semiconductor substrate, and a color filter and an on-chip lens are provided on an upper portion thereof.

SUMMARY

As described above, in the solid-state imaging device of the 3D structure, the connection electrode for electrically connecting the sensor substrate having the photoelectric conversion section to the circuit substrate and various material films are provided on the light receiving surface side of the semiconductor substrate. Thus, there is a concern that a distance from the light receiving surface of the sensor substrate to the on-chip lens may be large and hence light receiving characteristics in the photoelectric conversion section are likely to be degraded.

It is desirable to improve light receiving characteristics in a solid-state imaging device of a 3D structure in which a sensor substrate with a photoelectric conversion section and a circuit substrate with a driving circuit are laminated. Also, it is desirable to provide a method of manufacturing the solid-state imaging device. Further, it is desirable to provide an electronic device using the solid-state imaging device.

In accordance with the embodiments of the present technology described above, light receiving characteristics are improved in a solid-state imaging device. In addition, an electronic device improving image quality can be obtained using the solid-state imaging device.

In accordance with the embodiments of the present technology described above, it is possible to effectively prevent misalignment of bonding of two wafers, distortion or deformation of the two wafers, and occurrence of a void during bonding when the two wafers are bonded.

BRIEF DESCRIPTION OF THE DRAWINGS

FIG. 10 is a cross-sectional configuration diagram taken along a line B-B of FIG. 9;

FIG. 11A is a schematic configuration diagram of a sensor substrate of a solid-state imaging device in accordance with a third embodiment of the present disclosure;

FIG. 11B is an enlarged view in a region a of FIG. 11A;

FIG. 12 is a diagram schematically illustrating results obtained by simulating a state in which an organic material flows when the organic material is coated on the upper portion of an insulating layer in accordance with the second embodiment of the present disclosure;

FIG. 13 is a diagram schematically illustrating results obtained by simulating a state in which an organic material flows when the organic material is coated on an upper portion of an insulating layer in an example (for example, the second embodiment) in which a planar shape of a convex portion of the insulating layer is rectangular;

FIG. 29 is a diagram illustrating an apparatus for manufacturing a semiconductor device in accordance with the seventh embodiment of the present technology;

FIG. 30A is an explanatory diagram of deformation of a wafer in accordance with a reference example;

DETAILED DESCRIPTION OF THE EMBODIMENT(S)

Figure 1:
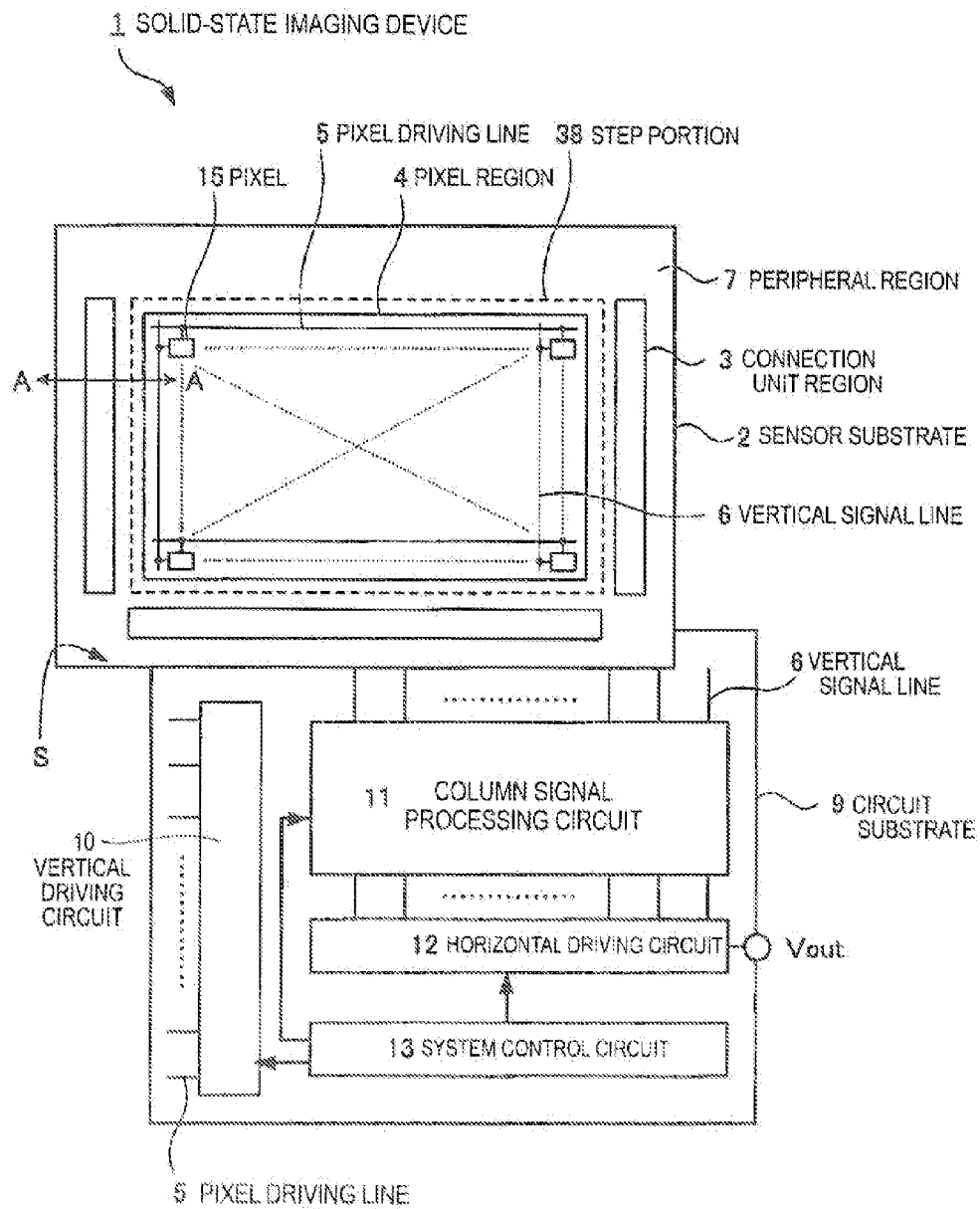
FIG. 1 is a schematic configuration diagram illustrating the whole of a complementary metal oxide semiconductor (CMOS) type solid-state imaging device in accordance with a first embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

1. First Embodiment

Solid-State Imaging Device

<1-1 Configuration of Entire Solid-State Imaging Device>

FIG. 1 is a schematic configuration diagram illustrating the whole of a CMOS type solid-state imaging device in accordance with the first embodiment of the present disclosure. The solid-state imaging device 1 of this embodiment is a back-surface illuminated solid-state imaging device having a 3D structure including a sensor substrate 2 in which a plurality of photoelectric conversion sections are arranged and a circuit substrate 9 bonded to the sensor substrate 2 in a state in which the circuit substrate 9 is laminated on the sensor substrate 2.

The sensor substrate 2, one surface of which is a light receiving surface S, includes a pixel region 4 in which a plurality of pixels 15 each including a photoelectric conversion section are two-dimensionally arranged within the light receiving surface S. In the pixel region 4, a plurality of pixel driving lines 5 are wired in a row direction, a plurality of vertical signal lines 6 are wired in a column direction, and the pixels 15 are arranged in a state in which one pixel 15 is connected to the pixel driving line 5 and the vertical signal line 6. In each pixel 15, a pixel circuit including a photoelectric conversion section, a charge accumulation section, a plurality of transistors (so-called metal oxide semiconductor (MOS) transistors), a capacitance element, and the like are provided. Also, part of the pixel circuit is provided on an opposite surface side from the light receiving surface S of the sensor substrate 2. In addition, part of the pixel circuit may be shared among the plurality of pixels 15.

In addition, the sensor substrate 2 includes a peripheral region 7 outside the pixel region 4. In the peripheral region 7, a connection unit region 3 is provided. The connection unit region 3 includes a plurality of connection sections (as will be described later) each connecting the pixel driving line 5, the vertical signal line 6, or the pixel circuit provided on the sensor substrate 2 to the driving circuit provided on the circuit substrate 9. In addition, in this embodiment, the connection unit region 3 is provided on each side in correspondence with three sides of the pixel region 4 partitioned in a rectangular shape in the peripheral region 7 of the pixel region 4, and is arranged along a corresponding side of the pixel region 4. In addition, a step portion 38 of an insulating layer as will be described later is formed in a boundary part between the connection unit region 3 and the pixel region 4 (see FIG. 2).

The circuit substrate 9 includes driving circuits such as a vertical driving circuit 10, a column signal processing circuit 11, a vertical driving circuit 12, and a system control circuit 13 for driving each pixel 15 provided on the sensor substrate 2 on a surface side facing the sensor substrate 2. These driving circuits are connected to desired wirings of the sensor substrate 2 in a connection unit.

The system control circuit 13 generates a clock signal, a control signal, and the like serving as the basis of operations of the vertical driving circuit 10, the column signal processing circuit 11, the horizontal driving circuit 12, and the like based on a horizontal synchronization signal and a master clock. Then, the clock signal, the control signal, and the like generated by the system control circuit 13 are input to the vertical driving circuit 10, the column signal processing circuit 11, the horizontal driving circuit 12, and the like.

The vertical driving circuit 10, for example, includes a shift register, and selectively scans the pixels 15 of the pixel region 4 provided on the sensor substrate 2 via the pixel driving line 5 sequentially in units of rows in a vertical direction. Then, a pixel signal based on signal charges generated according to an amount of light reception in the photoelectric conversion section (photodiode) of each pixel 15 is supplied to the column signal processing circuit 11 through the vertical signal line 6.

The column signal processing circuit 11 includes a plurality of unit circuits each processing a signal for each vertical signal line 6. In the column signal processing circuit 11, predetermined signal processing on a pixel signal output from each pixel 15 via the vertical signal line 6 for each column of the pixel 15 of the pixel region 4 of the sensor substrate 2 is performed and a pixel signal after the signal processing is temporarily held.

Specifically, the column signal processing circuit 11 performs at least a noise removal process, for example, such as correlated double sampling (CDS), as signal processing. According to the CDS process in the column signal processing circuit 11, for example, reset noise and fixed pattern noise unique to a pixel due to variation in a threshold value of an amplification transistor or the like can be removed.

The horizontal driving circuit 12, for example, includes a shift register, sequentially selects each unit circuit of the column signal processing circuit 11 by sequentially outputting a horizontal scan pulse, and outputs a pixel signal from each unit circuit of the column signal processing circuit 11. The output pixel signal is processed by a signal processing section (not illustrated), and the processed signal is output.

In addition, although not illustrated, a plurality of electrode pads are provided in a region on a further outer side of the connection unit region 3 provided in the peripheral region 7. The electrode pad is electrically connected to a desired wiring provided on the sensor substrate 2 or a wiring provided on the circuit substrate 9. Using the electrode pad, the wiring of each of the sensor substrate 2 and the circuit substrate 9 is drawn to the light receiving surface side of the sensor substrate 2.

Also, although the vertical driving circuit 10, the column signal processing circuit 11, and the horizontal driving circuit 12 are configured to be provided on the circuit substrate 9 in this embodiment, these circuits may be configured to be provided on the sensor substrate 2 and only the system control circuit 13 may be configured to be provided on the circuit substrate 9. That is, a circuit section to be formed on the circuit substrate 9 can be selected in various types.

<1-2 Configuration of Main Parts>

Figure 2:
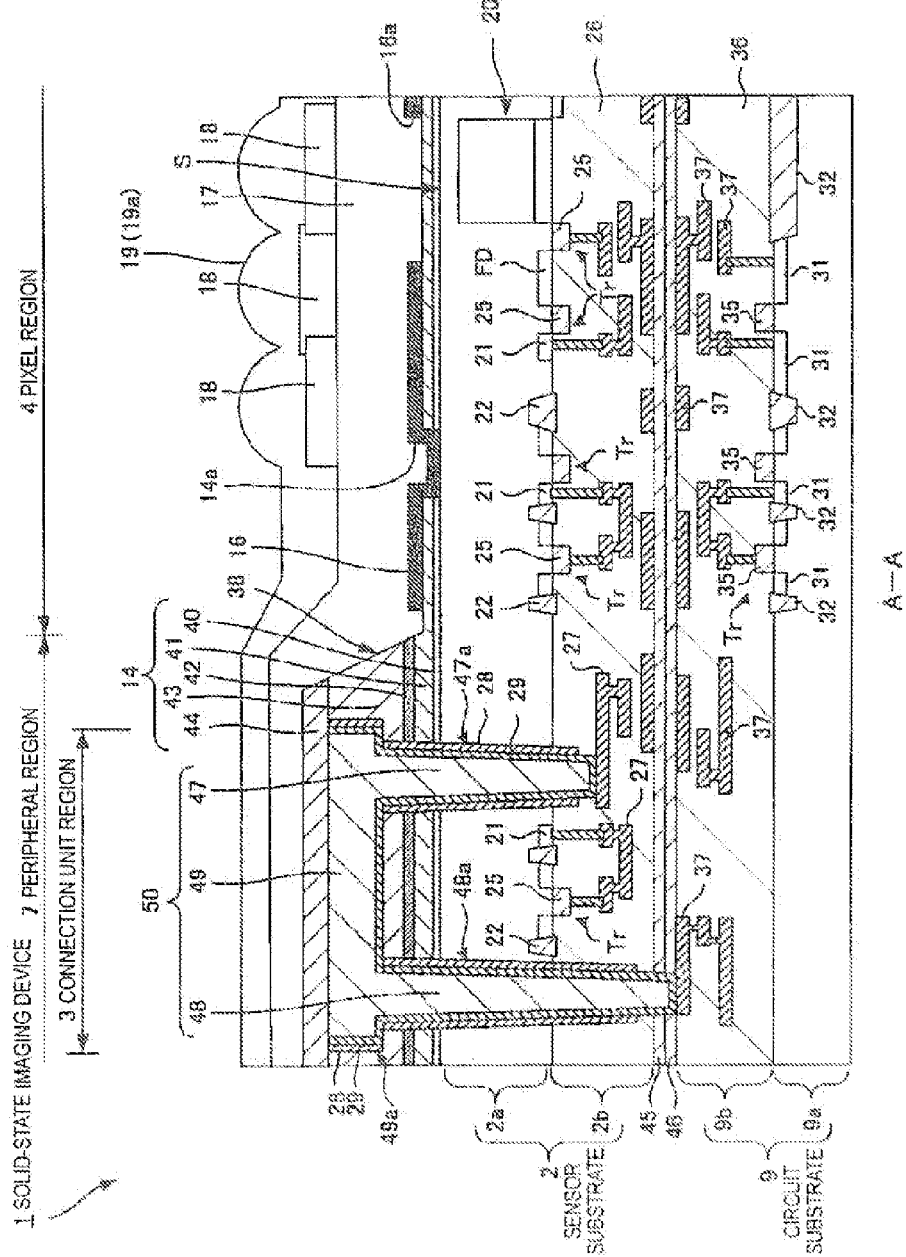
FIG. 2 is a cross-sectional configuration diagram taken along a line A-A of FIG. 1.

A cross-sectional configuration taken along a line A-A of FIG. 1 is illustrated in FIG. 2. That is, FIG. 2 is a cross-sectional view of a region including the pixel region 4 and the connection unit region 3. Hereinafter, a configuration of the solid-state imaging device 1 of this embodiment will be described based on the cross-sectional view of the main parts.

The solid-state imaging device 1 of this embodiment includes the sensor substrate 2, the circuit substrate 9 bonded to the opposite side of the light receiving surface S of the sensor substrate 2, and a connection section 50 for electrically connecting the sensor substrate 2 and the circuit substrate 9. In addition, the solid-state imaging device 1 of this embodiment includes an insulating layer 14 having a step portion 38 provided on the light receiving surface S of the sensor substrate 2, and a light shielding film 16, a transparent passivation film 17, a color filter 18, and an on-chip lens 19 provided in order on the insulating layer 14.

[Sensor Substrate]

The sensor substrate 2 includes a sensor-side semiconductor layer 2a and a sensor-side wiring layer 2b.

The sensor-side semiconductor layer 2a, for example, is obtained by thinning a semiconductor substrate formed of single-crystalline silicon. In the pixel region 4 in the sensor-side semiconductor layer 2a, a plurality of photoelectric conversion sections 20 are arranged and formed in a two-dimensional (2D) array shape along the light receiving surface S (the back surface in this embodiment). Each photoelectric conversion section 20, for example, includes a laminated structure of an n-type diffusion layer and a p-type diffusion layer. Also, the photoelectric conversion section 20 is provided for each pixel 15, and a cross section for one pixel is illustrated in FIG. 2.

In addition, in the sensor-side semiconductor layer 2a, a floating diffusion region FD formed by an n+ type impurity layer, a source/drain region 21 of a pixel transistor Tr, and an element separation section 22 for separating each pixel 15 are provided on the surface side opposite the light receiving surface S. Further, in the connection unit region 3 outside the pixel region 4 in the sensor-side semiconductor layer 2a, a first through electrode 47 and a second through electrode 48 constituting the connection section 50 are provided.

The sensor-side wiring layer 2b includes a gate electrode 25 provided via a gate insulating film (not illustrated) on the surface of the sensor-side semiconductor layer 2a and wirings 27 of a plurality of layers (three layers in FIG. 2) laminated via the interlayer insulating film 26 on an upper layer of the gate electrode 25. The wiring 27, for example, is formed of copper (Cu). In addition, if necessary, a mutual connection between laminated wirings 27 and between the wiring 27 and each pixel transistor Tr is made through a via. A pixel circuit for reading signal charges of each pixel 15 is formed by the pixel transistor Tr and the wiring 27 provided on the sensor-side wiring layer 2b.

In addition, on the surface on the opposite side of the sensor-side substrate 2a of the sensor-side wiring layer 2b, an insulating passivation film 45, which covers a wiring 27 of the top layer (a wiring 27 positioned closest to the circuit substrate 9), is provided. The surface of the passivation film 45 serves as a bonding surface between the sensor substrate 2 and the circuit substrate 9.

[Circuit Substrate]

The circuit substrate 9 includes a circuit-side semiconductor layer 9a and a circuit-side wiring layer 9b.

The circuit-side semiconductor layer 9a, for example, is obtained by thinning a semiconductor substrate formed of single-crystalline silicon. In addition, in the circuit-side semiconductor layer 9a, a source/drain region 31 of a transistor Tr, an element separation section 32, and an impurity layer (not illustrated here) are provided on the surface layer facing the sensor substrate 2.

Figure 3:
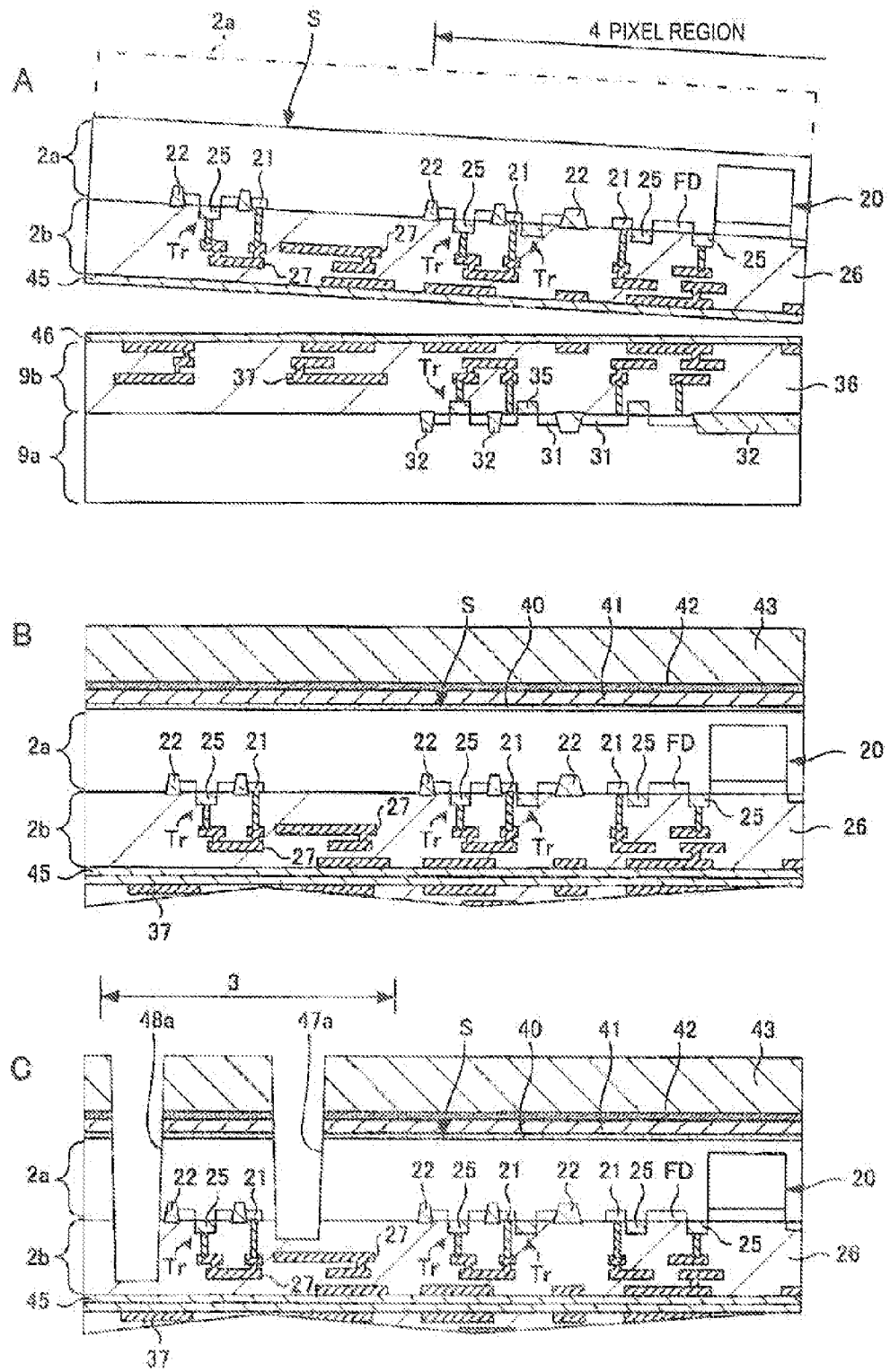
FIGS. 3A to 3C are process diagrams (part 1) illustrating a method of manufacturing the solid-state imaging device in accordance with the first embodiment of the present disclosure.
Figure 4:
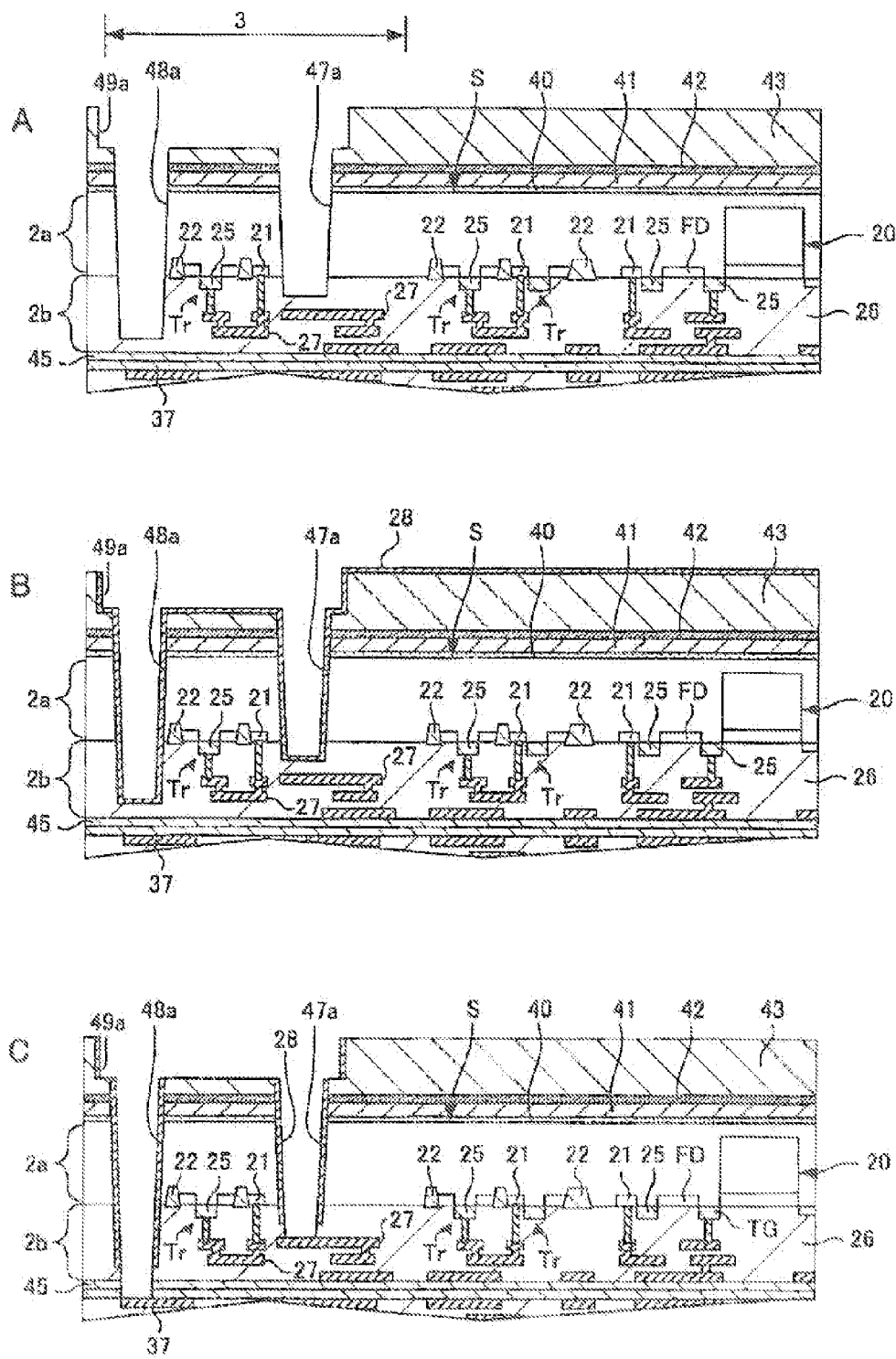
FIGS. 4A to 4C are process diagrams (part 2) illustrating the method of manufacturing the solid-state imaging device in accordance with the first embodiment of the present disclosure.
Figure 5:
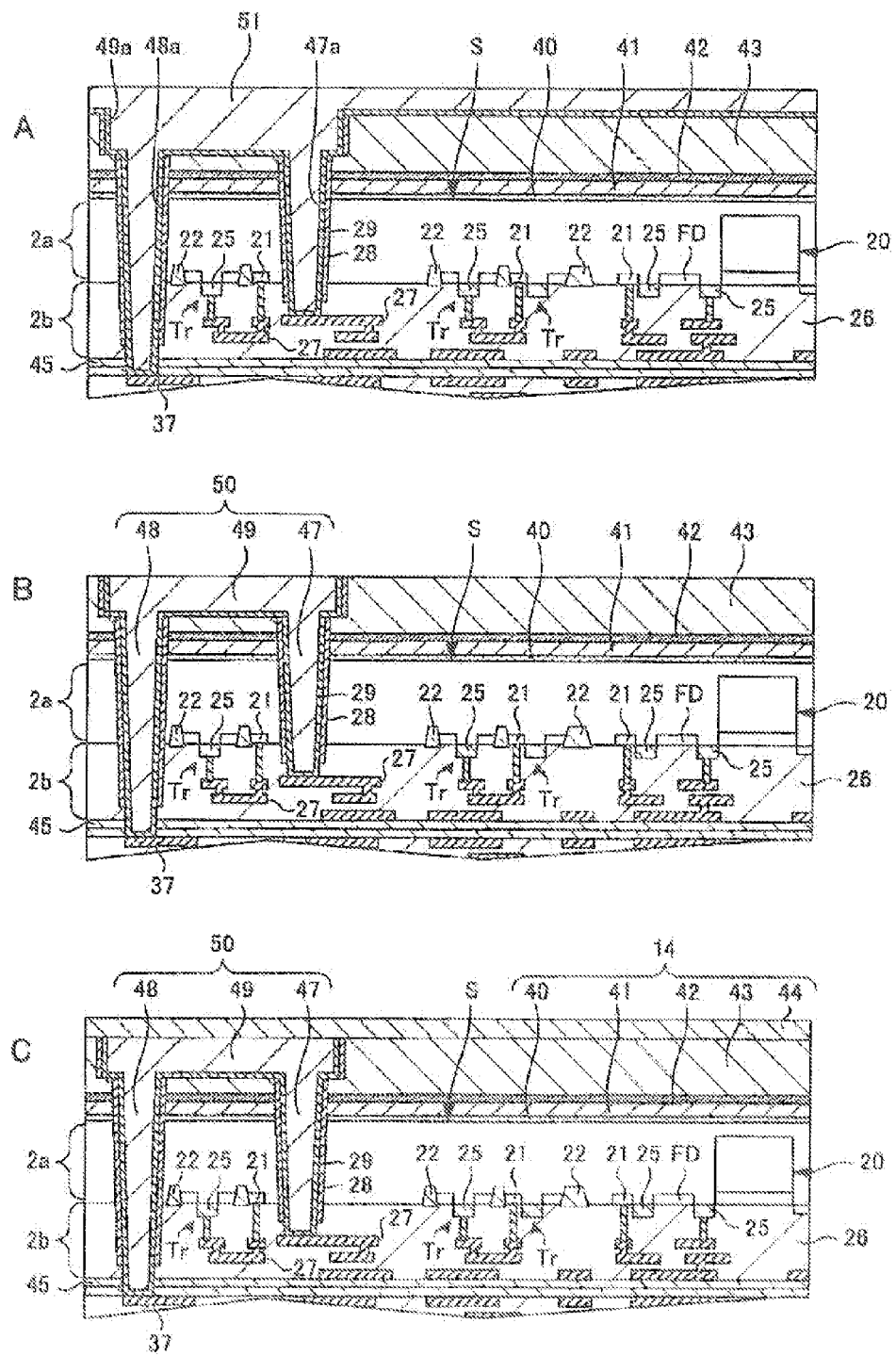
FIGS. 5A to 5C are process diagrams (part 3) illustrating the method of manufacturing the solid-state imaging device in accordance with the first embodiment of the present disclosure.
Figure 6:
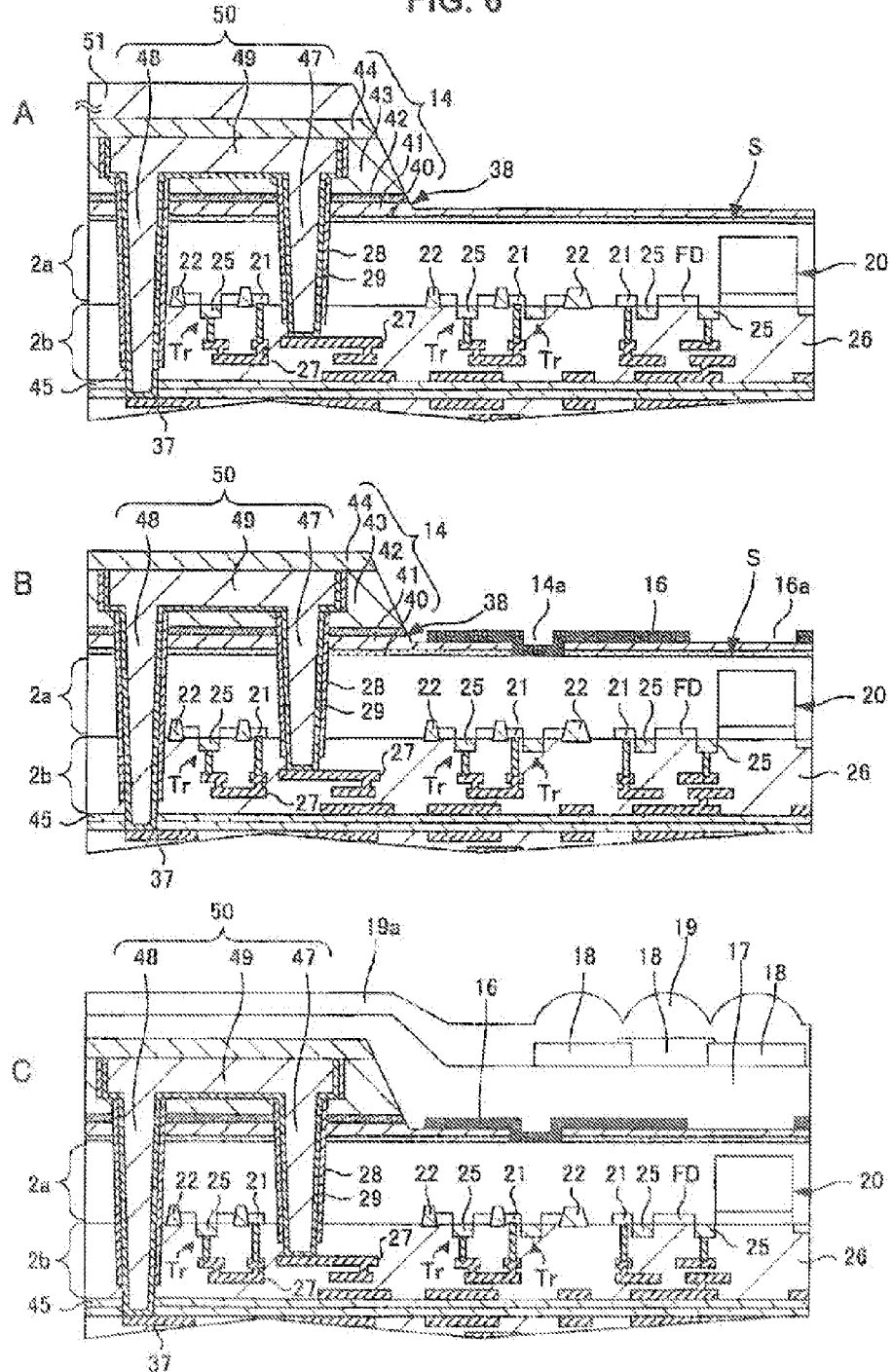
FIGS. 6A to 6C are process diagrams (part 4) illustrating the method of manufacturing the solid-state imaging device in accordance with the first embodiment of the present disclosure.

The circuit-side wiring layer 9b includes a gate electrode 35 provided via a gate insulating film (not illustrated) on the surface of the circuit-side semiconductor layer 9a and wirings 37 of a plurality of layers (three layers in FIG. 3) laminated via the interlayer insulating film 36 on an upper layer of the gate electrode 35. The wiring 37, for example, is formed of Cu. In addition, if necessary, a mutual connection between laminated wirings 37 and between the wiring 37 and each transistor Tr is made through a via provided in the interlayer insulating film 36. The driving circuit is formed by the pixel transistor Tr and the wiring 37 provided on the circuit-side wiring layer 9b. In addition, part of a second through electrode 48 constituting the connection section 50 as will be described later is provided in the connection unit region 3 of the circuit-side wiring layer 9b.

In addition, on the opposite surface from the circuit-side substrate 9a of the circuit-side wiring layer 9b, an insulating passivation film 46, which covers a wiring 37 of the top layer (a wiring 37 positioned closest to the sensor substrate 2), is provided. The surface of the passivation film 46 serves as a bonding surface between the sensor substrate 2 and the circuit substrate 9.

[Insulating Layer]

The insulating layer 14 is provided on the light receiving surface S of the sensor-side semiconductor layer 2a, and formed to embed the connection section 50 in the light receiving surface S of the sensor-side semiconductor layer 2a. In addition, the insulating layer 14 has the step portion 38 having a film thickness that is gradually thinned from the connection unit region 3 to the pixel region 4. In this embodiment, the film thickness of the insulating layer 14 is formed to be continuously thinned from the connection unit region 3 to the pixel region 4, and a tilted surface having a given tilt angle (a tapered shape) is formed on the step portion 38.

The above-described insulating layer 14, for example, is formed by laminating a plurality of films using insulating materials different from each other. In this embodiment, the insulating layer 14 is formed by a laminated film including five layers of an antireflective film 40, an interface state suppression film 41, an etching stopper film 42, an upper-layer insulating film 43, and a cap film 44 formed in order from the light receiving surface S of the sensor substrate 2.

The antireflective film 40, for example, is formed of an insulating material, which has a higher refractive index than silicon oxide, such as hafnium oxide ($HfO_2$), or tantalum oxide ($Ta_2O_5$), or silicon nitride. The interface state suppression film 41, for example, is formed of silicon oxide ($SiO_2$).

The etching stopper film 42 is formed of a material in which an etching selection ratio is suppressed to be lower than a material constituting the upper-layer insulating film 43 of an upper layer, and for example, is formed of silicon nitride (SiN). The upper-layer insulating film 43, for example, is formed of silicon oxide ($SiO_2$). The cap film 44, for example, is formed of silicon carbonitride (SiCN) or silicon nitride (SiN).

In the insulating layer 14 including a laminated film formed of the above-described five layers, the step portion 38 is formed by removing the cap film 44, the upper-layer insulating film 43, and the etching stopper film 42 from the pixel region 4. That is, the insulating layer 14 is a structure of five layers in the peripheral region 7 including the connection unit region 3, and the insulating layer 14 is a structure of two layers in the pixel region 4.

[Connection Section]

The connection section 50 includes a first through electrode 47, a second through electrode 48, and a connection electrode 49. In addition, a plurality of connection sections 50 are provided for each connection unit region 3 illustrated in FIG. 1.

The first through electrode 47 is provided to penetrate the sensor-side semiconductor layer 2a from the insulating layer 14 and reach the wiring 27 of the lowest layer of the sensor-side wiring layer 2b (the wiring 27 positioned closest to the sensor-side semiconductor layer 2a). The first through electrode 47 is formed of a conductive material embedded via a separation insulating film 28 and a barrier metal film 29 within a first through hole 47a provided to expose the wiring 27 of the top layer of the sensor-side wiring layer 2b from the light receiving surface S of the sensor-side semiconductor layer 2a.

The second through electrode 48 is provided in a region adjacent to the first through electrode 47, and provided to penetrate the sensor-side semiconductor layer 2a and the sensor-side wiring layer 2b from the insulating layer 14 and reach the wiring 37 of the top layer of the circuit-side wiring layer 9b (the wiring 37 farthest from the circuit-side semiconductor layer 9a). The second through electrode 48 is formed of a conductive material embedded via the separation insulating film 28 and the barrier metal film 29 within a second through hole 48a provided to expose the wiring 37 of the top layer of the circuit-side wiring layer 9b from the light receiving surface S of the sensor-side semiconductor layer 2a.

The connection electrode 49 is provided to electrically connect the first through electrode 47 to the second through electrode 48 within the insulating layer 14 provided on the light receiving surface S of the sensor-side semiconductor layer 2a. The connection electrode 49 is formed of a conductive material embedded within a connection hole 49a that connects a first through hole 47a and a second through hole 48a.

As conductive materials constituting the first through electrode 47, the second through electrode 48, and the connection electrode 49, Cu, aluminum (Al), tungsten (W), or the like can be used. In this embodiment, Cu is used as the conductive material constituting the first through electrode 47, the second through electrode 48, and the connection electrode 49.

[Light Shielding Film]

The light shielding film 16 is provided on the insulating layer 14 of the pixel region 4, that is, on an upper portion of the interface state suppression film 41, which is a film of the top layer of the insulating layer 14 in the pixel region 4. The light shielding film 16 includes a light receiving opening 16a provided in a formation region of the photoelectric conversion section 20 of each pixel 15, and is provided to shield light between adjacent pixels 15.

The light shielding film 16 is formed using a conductive material with excellent light shielding characteristics, and, for example, is formed using W, Al, Ti, titanium nitride (TiN), Cu, or tantalum (Ta). In addition, the light shielding film 16 can be formed of a laminated film including the above-described material films.

[Transparent Passivation Film]

The transparent passivation film 17 is provided to cover the upper portions of the light shielding film 16 and the insulating layer 14. The transparent passivation film 17, for example, is formed using an acrylic resin or the like.

[Color Filter]

The color filter 18 is provided on an upper portion of the transparent passivation film 17 in correspondence with each photoelectric conversion section 20. For example, a filter layer, which selectively transmits red (R), green (G), or blue (B) light, is arranged for each pixel 15. In addition, the filter layers, for example, are arranged for each pixel 15 in a Bayer arrangement.

In the color filter 18, light of a desired wavelength is transmitted. The transmitted light is incident on the photoelectric conversion section 20 within the sensor-side semiconductor layer 2a. Also, although each pixel 15 is configured to transmit light of one of R, G, and B in this embodiment, the present technology is not limited thereto. In addition, an organic material for transmitting light of cyan, yellow, magenta, or the like may be used as a material constituting the color filter 18, and various selections are possible according to specs.

[On-Chip Lens]

The on-chip lens 19 is formed on the upper portion of the color filter 18, and is formed for each pixel 15. In the on-chip lens 19, incident light is condensed and the condensed light is efficiently incident on each photoelectric conversion section 20 via the color filter 18. Also, in this embodiment, the on-chip lens 19 is configured to cause the incident light to be condensed at a center position of the photoelectric conversion section 20 opened in the light shielding film 16.

<1-3 Manufacturing Method>

FIGS. 3 to 6 are process diagrams illustrating a method of manufacturing the solid-state imaging device 1 of this embodiment. The method of manufacturing the solid-state imaging device of this embodiment will be described using FIGS. 3 to 6.

First, as illustrated in FIG. 3A, a plurality of photoelectric conversion sections 20 are formed in the pixel region 4 in the sensor-side semiconductor layer 2a, and a floating diffusion region FD, a source/drain region 21, and an element separation section 22 are formed in a desired region of the sensor-side semiconductor layer 2a. In addition, an impurity region (not illustrated) is formed in the sensor-side semiconductor layer 2a. Impurity layers such as the photoelectric conversion section 20, the floating diffusion region FD, the source/drain region 21, the element separation section 22, and the like formed in the sensor-side semiconductor layer 2a can be formed by ion implantation from the surface (the surface on the opposite side of the light receiving surface S) side of the sensor-side semiconductor layer 2a.

Next, gate electrodes 25 constituting pixel transistors Tr are formed on the surface of the sensor-side semiconductor layer 2a via a gate insulating film (not illustrated), and wirings 27 of a plurality of layers (three layers in FIG. 3A) are formed on the upper portion of the gate electrodes 25 via the interlayer insulating film 26. At this time, if necessary, a via for connecting the wiring 27 and the pixel transistor Tr or a via for connecting two adjacent wirings 27 in a lamination direction is formed by forming a vertical hole in the interlayer insulating film 26 and embedding the vertical hole in a conductive material. Thereafter, the passivation film 45 is formed on the upper portion of the interlayer insulating film 26 including the wiring 27 of the top layer.

On the other hand, the circuit-side semiconductor layer 9a is provided separately from the sensor-side semiconductor layer 2a, and the source/drain region 31, the element separation section 32, and other impurity layers (not illustrated) are formed on one surface of the circuit-side semiconductor layer 9a. Impurity layers such as the source/drain region 31, the element separation section 32, and the like formed in the circuit-side semiconductor layer 9a can be formed by ion implantation from the surface side of the circuit-side semiconductor layer 9a.

Next, a gate electrode 35 constituting each transistor Tr is formed on the one surface of the circuit-side semiconductor layer 9a via a gate insulating film (not illustrated), and wirings 37 of a plurality of layers (three layers in FIG. 3A) are formed on the upper portion of the gate electrode 35 via the interlayer insulating film 36. At this time, if necessary, a via for connecting the wiring 37 and the transistor Tr or a via for connecting two adjacent wirings 37 in a lamination direction is formed by forming a vertical hole in the interlayer insulating film 36 and embedding the vertical hole in a conductive material. Thereafter, the passivation film 46 is formed on the upper portion of the interlayer insulating film 36 including the wiring 37 of the top layer.

Thereafter, the sensor substrate 2 is bonded to the circuit substrate 9 by causing a surface on which the passivation film 45 of the sensor substrate 2 is formed to face a surface on which the passivation film 46 of the circuit substrate 9 is formed. After the bonding, if necessary, the light receiving surface S (the back-surface side) of the sensor-side semiconductor layer 2a is thinned. A procedure of the process thus far is not particularly limited, and can be performed by applying normal bonding technology.

Next, as illustrated in FIG. 3B, the antireflective film 40, the interface state suppression film 41, the etching stopper film 42, and the upper-layer insulating film 43 are laminated and formed in this order on the light receiving surface S of the sensor-side semiconductor layer 2a. The antireflective film 40, for example, is formed of hafnium oxide, and formed with a film thickness of 10 nm to 300 nm (for example, 60 nm) according to an atomic layer deposition method. The interface state suppression film 41 is formed of $SiO_2$, and, for example, formed with a film thickness of 200 nm according to a plasma-chemical vapor deposition (P-CVD) method. The etching stopper film 42, for example, is formed of silicon nitride (SiN), and formed with a film thickness of 50 to 200 nm according to the P-CVD method. The upper-layer insulating film 43, for example, is formed of silicon oxide, and formed with a film thickness of 200 nm according to the P-CVD method.

Next, as illustrated in FIG. 3C, in the connection unit region 3, a first through hole 47a and a second through hole 48a are formed to penetrate the sensor-side semiconductor layer 2a from the surface of the upper-layer insulating film 43 and reach the sensor-side wiring layer 2b. The first through hole 47a, for example, is formed to a depth not reaching the wiring 27 of the lowest layer of the sensor-side wiring layer 2b (a layer closest to the sensor-side semiconductor layer 2a), and formed to a depth at which the wiring 27 is not exposed. In addition, the second through hole 48a, for example, is formed to a depth not reaching the wiring 27 of the top layer of the sensor-side wiring layer 2b (a layer closest to the circuit substrate 9), and formed to a depth at which the wiring 37 is not exposed.

When the first through hole 47a and the second through hole 48a are formed, a resist pattern (not illustrated) is formed on the upper portion of the upper-layer insulating film 43. A plurality of etches are performed using the resist pattern as a mask. After a process of etching each of the first through hole 47a and the second through hole 48a has ended, each resist pattern is removed from the upper portion of the upper-layer insulating film 43.

Next, as illustrated in FIG. 4A, a connection hole 49a is formed in a region including the first through hole 47a and the second through hole 48a. The connection hole 49a is formed to a depth not reaching an etching stopper film 42 from the surface of the upper-layer insulating film 43. When the connection hole 49a is formed, a resist pattern (not illustrated) in which a region forming the connection hole 49a is opened is formed on the upper portion of the upper-layer insulating film 43, and the upper-layer insulating film 43 is etched using the resist pattern as the mask.

Next, as illustrated in FIG. 4B, a separation insulating film 28 is formed in a state in which inner walls of the first through hole 47a, the second through hole 48a, and the connection hole 49a are covered therewith. The separation insulating film 28, for example, is formed of silicon oxide, and formed with a film thickness of 100 to 1000 nm according to the P-CVD method. Through the separation insulating film 28, the first through electrode 47 formed in the first through hole 47a, the second through electrode 48 formed in the second through hole 48a, and the sensor-side semiconductor layer 2a are electrically separated therebetween.

Next, as illustrated in FIG. 4C, the separation insulating film 28 is etched and removed according to a condition of high anisotropic etching and hence the separation insulating film 28 of the bottom portions of the first through hole 47a and the second through hole 48a is removed. Then, the bottom portion of each of the third through hole 47a and the second through hole 48a is dug according to a condition of high anisotropic etching. Thereby, the wiring 27 of the lowest layer of the sensor-side wiring layer 2b is exposed on the bottom portion of the first through hole 47a, and the wiring 37 of the lowest layer of the circuit-side wiring layer 9b is exposed on the bottom portion of the second through hole 48a.

Next, as illustrated in FIG. 5A, the barrier metal film 29 is formed to cover inner walls of the first through hole 47a, the second through hole 48a, and the connection hole 49a. The barrier metal film 29, for example, is formed of tantalum nitride (TaN), and formed with a thickness of 5 to 100 nm according to a PVD method. Subsequently, a conductive material formed of Cu is formed on the barrier metal film 29 according to a plating method. Thereby, Cu is embedded in the first through hole 47a, the second through hole 48a, and the connection hole 49a.

Next, as illustrated in FIG. 5B, a conductive material layer is polished using a chemical mechanical polishing (CMP) method, and the surface is leveled until the upper-layer insulating film 43 is exposed. Thereby, the first through hole 47, the second through hole 48, and the connection hole 49 for electrically connecting the first through hole 47 and the second through hole 48 are formed. As described above, the connection section 50 is formed according to a so-called dual damascene method in this embodiment.

Next, the cap film 44 is formed on the surface of the upper-layer insulating film 43 including the connection electrode 49. The cap film 44, for example, is formed of silicon nitride (SiN), and formed with a thickness of 5 to 100 nm according to the P-CVD method. Then, in this embodiment, the insulating layer 14 of the light receiving surface S of the sensor-side semiconductor layer 2a is formed by a laminated film of five layers including the antireflective film 40, the interface state suppression film 41, and the etching stopper film 42, the upper-layer insulating film 43, and the cap film 44.

Next, as illustrated in FIG. 6A, a portion corresponding to the pixel region 4 of the insulating layer 14 is selectively thinned for the connection unit region 3. Here, as illustrated in FIG. 6A, a resist pattern 51 is formed on the upper portion of the insulating layer 14. The resist pattern 51 is formed by forming an opening in a region corresponding to the pixel region 4 after forming a resist material layer on the entire upper surface of the insulating layer 14 and then causing an end portion of an opening side to reflow according to a post-bake process.

Then, the insulating layer 14 on the upper portion of the pixel region 4 is etched to a predetermined depth using the resist pattern 51 as the mask and removed. In this etching process, the cap film 44 and the upper-layer insulating film 43 are etched while etching conditions are changed, and the etching is stopped by the etching stopper film 42 of a lower layer. Thereafter, the etching stopper film 42 is further etched by changing the etching conditions, and the etching ends at a point in time at which the interface state suppression film 41 has been exposed.

In a series of etching processes in FIG. 6A, etching is performed so that the insulating layer 14 is gradually thinned from the connection unit region 3 (an end portion of the resist pattern 51) to the pixel region 4 while the etching conditions are occasionally changed. Thereby, in the insulating layer 14, the step portion 38 with a tapered shaped is formed in a boundary portion between the connection unit region 3 and the pixel region 4.

In this embodiment, it is possible to temporarily reset etching variation, which may occur due to etching of the upper-layer insulating film 43, on the surface of the etching stopper film 42 by forming the etching stopper film 42. Thereby, it is possible to maintain flatness of the surface of the insulating layer 14 on the upper layer of the pixel region 4. Then, according to etching of the insulating layer 14, only the antireflective film 40 and the interface state suppression film 41 remain on the upper surface of the pixel region 4, and the insulating layer 14 with a structure of the five layers directly remains in the peripheral region 7 including the connection unit region 3.

Next, as illustrated in FIG. 6B, the insulating layer 4 is etched at a predetermined position of the pixel region 4, and an opening 14a is formed to expose the sensor-side semiconductor layer 2a. At this time, the interface state suppression film 41 and the antireflective film 40 are etched using a resist pattern (not illustrated here) as a mask. Also, the opening 14a is formed at a position away from a region directly above the photoelectric conversion section 20.

Next, on the insulating layer 14 of the pixel region 4, the light shielding film 16 connected to the sensor-side semiconductor layer 2a via the opening 14a is patterned and formed. The light shielding film 16 has a light receiving opening 16a corresponding to the photoelectric conversion section 20. Here, for example, a conductive material film is formed of W on the insulating layer 14 according to a sputtering film-forming method. Thereafter, a conductive material film is patterned and etched using a resist pattern (not illustrated here) as a mask. Thereby, the light receiving opening 16a, which widely covers the insulating layer 14 of the pixel region 4 and corresponds to each photoelectric conversion section 20, is provided, and the light shielding film 16 connected to the sensor-side semiconductor layer 2a is formed.

Next, as illustrated in FIG. 6C, the transparent passivation film 17 formed of a light transmissive material is formed in a state in which the upper portions of the light shielding film 16 and the insulating layer 14 are covered therewith. The transparent passivation film 17 is formed by a coating method such as a spin coating method. Next, the color filter 18 of each color corresponding to the photoelectric conversion section 20 is formed on the transparent passivation film 17, and an on-chip lens film 19a with the on-chip lens 19 corresponding to the photoelectric conversion section is further formed on the upper portion thereof. In this manner, the solid-state imaging device 1 of this embodiment is manufactured.

In this embodiment, it is possible to reduce a distance between the on-chip lens 19 and the light receiving surface S by making the insulating layer 14 formed on the light receiving surface S of the sensor-side semiconductor layer 2a thin in the pixel region 4. Thereby, light focusing characteristics or sensitivity characteristics are improved.

Incidentally, there is a concern that a pressure of fluid will be concentrated on a step portion when the organic material is laid over the step and uneven coating may occur if there is a steep step on a coated surface when an organic resin material is coated. In this embodiment compared to the above, the fluid pressure is reduced in the step portion 38 when the organic material is coated on the upper portion of the insulating layer 14 because the step portion 38 of the insulating layer 14 is formed in a tapered shape. Thereby, the even coating is reduced, and the organic material film can be formed flat on the upper portion of the insulating layer 14 of the pixel region 4.

Although the step portion 38 of the insulating layer 14 is formed in the tapered shaped in this embodiment, the insulating layer 14 may be formed with a film thickness that is gradually thinned from the connection unit region 3 to the pixel region 4, formed to be continuously thinned, or formed to be thinned step by step. Because the flow of the organic resin material is further smoothed in the upper portion of the insulating layer when a film thickness of the insulating layer 14 is formed to be continuously thinned as in this embodiment, it is possible to further suppress uneven coating of the organic resin material.

In addition, although an example in which the etching stopper film 42 is provided and etching is applied to the etching stopper film 42 has been described in this embodiment, the process of etching the insulating layer 14 is not limited thereto. It is possible to adopt various configurations as long as the film thickness of the insulating layer 14 in the pixel region 4 can be configured to be thinner than a film thickness of the insulating layer 14 in the connection unit region 3.

Further, although an example in which the connection unit region 3 is formed on each of the three sides of the pixel region 4 has been described in this embodiment, the region in which the connection unit region 3 is formed is not limited thereto. Hereinafter, an example in which a formation position of the connection unit region 3 is different from that of the first embodiment will be described as a modified example.

Modified Example 1-1

Figure 7:
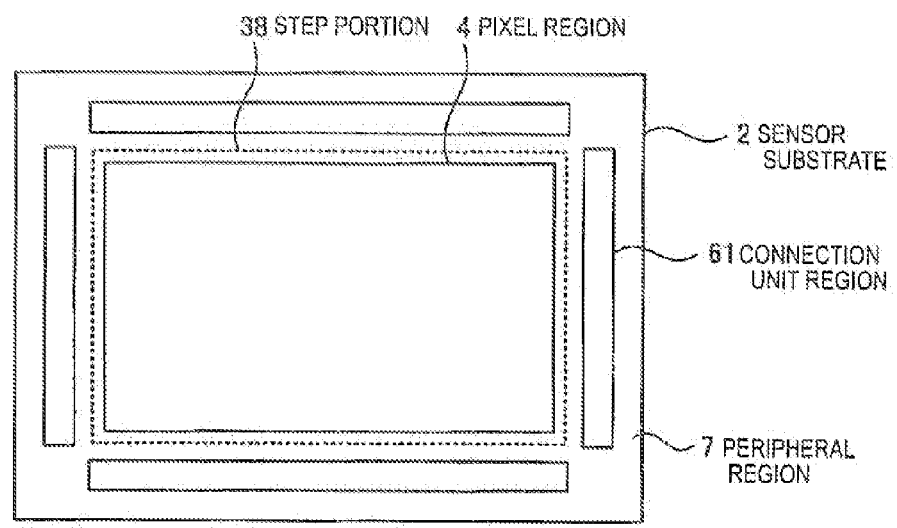
FIG. 7 is a schematic configuration diagram of a sensor substrate of a solid-state imaging device in accordance with a modified example 1-1.

FIG. 7 is a schematic configuration diagram of a sensor substrate 2 of a solid-state imaging device 60 in accordance with the modified example 1-1. The solid-state imaging device 60 in the modified example 1-1 is different from the solid-state imaging device 1 illustrated in FIG. 1 only in terms of a layout of formation positions of connection unit regions 61. That is, even in the modified example 1-1, as in FIG. 1, the circuit substrate 9 is provided on a surface on the opposite side of the light receiving surface of the sensor substrate 2, and a cross-sectional configuration thereof is similar to that of FIG. 2. Accordingly, because cross-sectional configurations of the circuit substrate 9 and the solid-state imaging device 60 are similar to those of FIGS. 1 and 2, description thereof is omitted here. In addition, parts of FIG. 7 corresponding to those of FIG. 1 are assigned the same reference signs, and redundant description thereof is omitted here.

In the modified example 1-1, as illustrated in FIG. 7, the connection unit regions 61 are provided at four positions of the peripheral region 7 outside the pixel region 4 and arranged along sides of the pixel region 4, respectively. Even in the modified example 1-1, as in the first embodiment, the step portion 38 is formed on the insulating layer of the upper portion of the sensor-side semiconductor layer. Therefore, even in the configuration in the modified example 1-1, as in the first embodiment, it is possible to have an effect similar to that of the first embodiment by gradually thinning the film thickness of the insulating layer from the connection unit region 61 to the pixel region 4 and forming the step portion 38 in the tapered shape.

Modified Example 1-2

Figure 8:
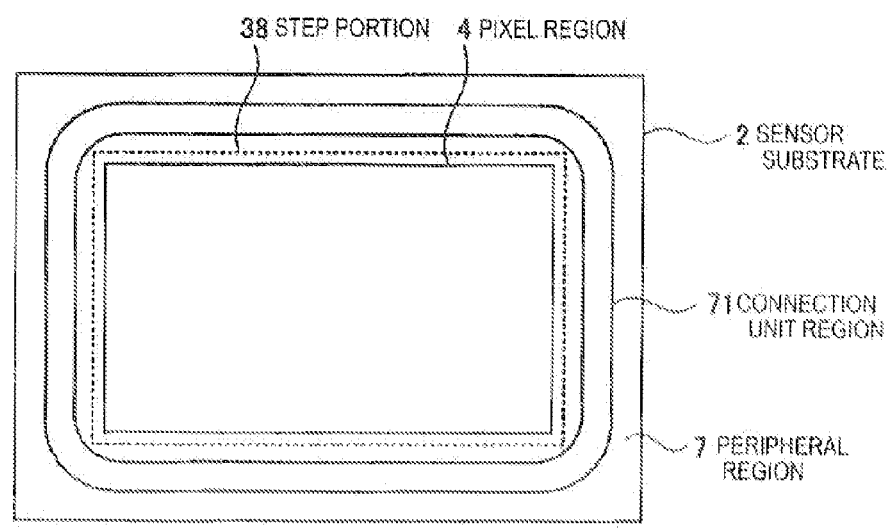
FIG. 8 is a schematic configuration diagram of a sensor substrate of a solid-state imaging device in accordance with a modified example 1-2.

FIG. 8 is a schematic configuration diagram of a sensor substrate 2 of a solid-state imaging device 70 in accordance with the modified example 1-2. The solid-state imaging device 70 in the modified example 1-2 is different from the solid-state imaging device 1 illustrated in FIG. 1 only in terms of a layout of formation positions of connection unit regions 71. That is, even in the modified example 1-2, as in FIG. 1, the circuit substrate 9 is provided on a surface on the opposite side of the light receiving surface of the sensor substrate 2, and a cross-sectional configuration thereof is similar to that of FIG. 2. Accordingly, because cross-sectional configurations of the circuit substrate 9 and the solid-state imaging device 70 are similar to those of FIGS. 1 and 2, description thereof is omitted here. In addition, parts of FIG. 8 corresponding to those of FIG. 1 are assigned the same reference signs, and redundant description thereof is omitted here.

In the modified example 1-2, as illustrated in FIG. 8, the connection unit regions 71 are provided in the peripheral region 7 outside the pixel region 4 and continuously arranged to surround the pixel region 4. Even in the modified example 1-2, as in the first embodiment, the step portion 38 is formed on the insulating layer of the upper portion of the sensor-side semiconductor layer. Thus, even in the configuration in the modified example 1-2, as in the first embodiment, it is possible to have an effect similar to that of the first embodiment by gradually thinning the film thickness of the insulating layer from the connection unit region 71 to the pixel region 4 and forming the step portion 38 in the tapered shape.

Incidentally, an example in which the insulating film formed in the upper portion of the sensor-side semiconductor layer 2a is thinned and the step portion 38 of the insulating layer 14 is provided only in the boundary portion between the connection unit region 3 and the pixel region 4 has been described in the above-described first embodiment. However, a thin film portion in the insulating layer 14 may be set in as wide a range as possible in a range in which there is no influence on the connection section 50. Hereinafter, an example in which the step portion of the insulating layer 14 is provided to surround the periphery of the connection unit region 3 will be described.

2. Second Embodiment

Solid-State Imaging Device

Figure 9:
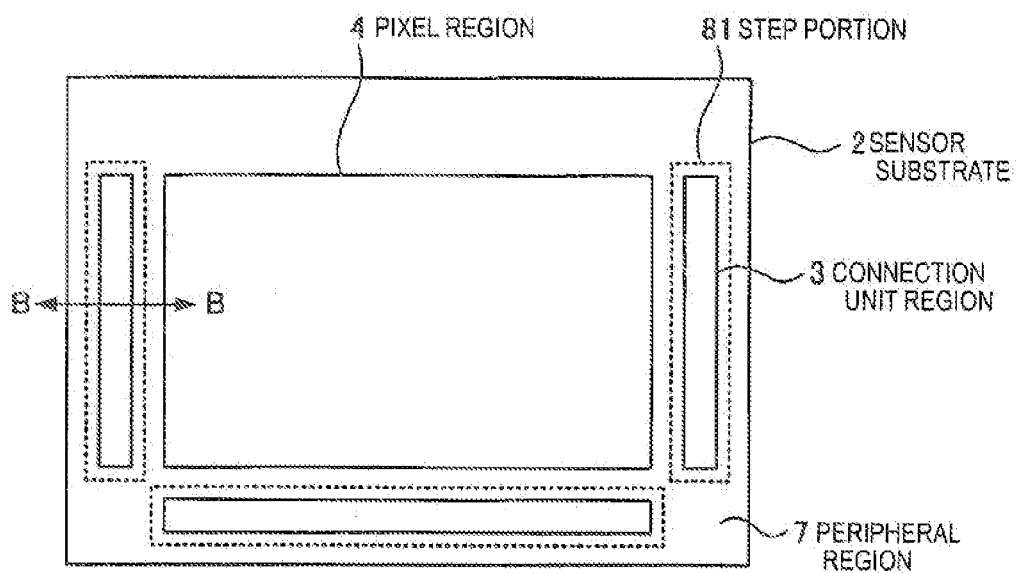
FIG. 9 is a configuration diagram of a sensor substrate of a solid-state imaging device in accordance with a second embodiment of the present disclosure.

FIG. 9 is a configuration diagram of a sensor substrate 2 of a solid-state imaging device 80 in accordance with the second embodiment of the present disclosure, and FIG. 10 is a cross-sectional configuration diagram taken along a line B-B of FIG. 9. Even in this embodiment, as in FIG. 1, the circuit substrate 9 is provided on a surface on the opposite side of the light receiving surface of the sensor substrate 2. Accordingly, because the configuration of the circuit substrate 9 is similar to that of FIG. 1, description thereof is omitted here. In addition, parts of FIGS. 9 and 10 corresponding to those of FIGS. 1 and 2 are assigned the same reference signs, and redundant description thereof is omitted here.

In the solid-state imaging device 80 of this embodiment, a step portion 81 of the insulating layer 14 provided on the upper portion of the sensor-side semiconductor layer 2a is formed to surround each connection unit region 3. That is, in this embodiment, in a region other than the connection unit region 3, the insulating layer 14 on the upper portion of the sensor-side semiconductor layer 2a is thinned as on the upper portion of the pixel region 4.

As illustrated in FIG. 10, in the insulating layer 14 provided on the upper portion of the sensor-side semiconductor layer 2a in the solid-state imaging device 80 of this embodiment, the step portion 81 is formed in a boundary between the connection unit region 3 and an adjacent region outside the connection unit region 3. In addition, as in the first embodiment, the step portion 81 of the insulating layer 14 is formed to be gradually thinned from the connection unit region 3 to a region adjacent to the connection unit region 3 in a tapered shape.

As described above, in this embodiment, a convex portion 82 of a cross-sectional convex shape is formed on the insulating layer 14 by thinning the insulating layer 14 in a region other than the connection unit region 3. Therefore, the connection section 50 formed in the connection unit region 3 is formed inside the convex portion 82.

The above-described solid-state imaging device 80 of this embodiment can be formed by modifying the resist pattern to be used in the process of etching the insulating layer 14 illustrated in FIG. 6A from that of the first embodiment. For example, it is possible to manufacture the solid-state imaging device 80 of this embodiment by performing etching using a resist pattern for opening a region other than the connection unit region 3 as a mask. Even in the above-described solid-state imaging device 80 of this embodiment, it is possible to have an effect similar to that of the first embodiment.

3. Third Embodiment

Solid-State Imaging Device

Next, the solid-state imaging device in accordance with the third embodiment of the present disclosure will be described. FIG. 11A is a schematic configuration diagram of a sensor substrate 2 of a solid-state imaging device 90 in accordance with this embodiment, and FIG. 11B is an enlarged view in a region a of FIG. 11A. Even in this embodiment, as in FIG. 1 (the first embodiment), the circuit substrate 9 is provided on a surface on the opposite side of the light receiving surface of the sensor substrate 2. Accordingly, because cross-sectional configurations of the circuit substrate 9 and the solid-state imaging device 90 are similar to those of FIG. 10, description thereof is omitted here. In addition, parts of FIG. 11A corresponding to those of FIG. 1 are assigned the same reference signs, and redundant description thereof is omitted here.

The solid-state imaging device 90 of this embodiment is an example in which a layout of the step portion 91 of the insulating layer 14 is different from that of FIG. 9. In this embodiment, the step portion 91 of the insulating layer 14 is provided at a position in which the connection unit region 3 is encircled. In addition, a planar shape of the convex portion 92 of the insulating layer 14 formed by the step portion 91 is formed to be a circular arc-like corner-round rectangular shape in two end portions orthogonal to a direction along a corresponding side of the pixel region 4.

Here, as illustrated in FIG. 11B, it is preferable that a curvature radius R in the circular arc-like end portion of the convex portion 92 be greater than 0.2 μm. In addition, the above-described shape of the convex portion 92 may be formed by adding the circular arc-like end portion to the convex portion 82 with the rectangular planar shape illustrated in FIG. 9. In addition, the shape of the convex portion 92 may be formed by cutting corner portions from the convex portion 82 with the rectangular planar shape illustrated in FIG. 9.

The above-described solid-state imaging device 90 of this embodiment can be formed by modifying the resist pattern to be used in the process of etching the insulating layer 14 illustrated in FIG. 6A from that of the first embodiment. For example, it is possible to manufacture the solid-state imaging device 90 of this embodiment by performing etching using a resist pattern for opening a region other than the connection unit region 3 as a mask.

FIG. 12 is a diagram schematically illustrating results obtained by simulating a state in which an organic material flows when the organic material is coated on the upper portion of the insulating layer 14 having the convex portion 92 of this embodiment. In addition, FIG. 13 is a diagram schematically illustrating results obtained by simulating a state in which an organic material flows when the organic material is coated on the upper portion of the insulating layer 14 in an example (for example, the second embodiment) in which a planar shape of the convex portion 92 of the insulating layer 14 is rectangular. The arrows of FIGS. 12 and 13 are fluid vectors, a direction of the arrow indicates a flow direction of the organic material coated on the upper portion of the insulating layer 14, and a length of the arrow indicates a flow speed of the organic material that flows in the arrow direction.

When the planar shape of the convex portion 82 of the insulating layer 14 is rectangular as illustrated in FIG. 13, the fluid pressure of the organic material has a tendency to be high in a portion corresponding to a corner portion of the convex portion 82. Thereby, the fluid flowing toward the corner portion of the convex portion 82 is divided into a component of an original direction in which the fluid flows and a component of a direction along a sidewall of the convex portion 82 using the corner portion as the origin. Thereby, uneven coating occurs.

On the other hand, when the planar shape of the convex portion 92 of the insulating layer 14 is set to a circular arc-like corner-round rectangular shape in two end portions orthogonal to a direction along a corresponding side of the pixel region 4 as illustrated in FIG. 12, a local increase in the fluid pressure of the organic material flowing on the insulating layer 14 is reduced. Thus, for a fluid flowing toward the circular arc-like end portion of the convex portion 92, dispersion having the end portion of the convex portion 92 as the starting point is mitigated. Thereby, uneven coating of the organic material is reduced.

As described above, in this embodiment, it is possible to further improve the flatness of the organic material film to be coated on the insulating layer 14 of the pixel region 4 by forming the planar shape of the convex portion 92 in a corner-round rectangular shape.

Although the planar shape of the convex portion 92 of the insulating layer 14 is the corner-round rectangular shape in the above-described third embodiment, the planar shape of the convex portion capable of mitigating the fluid pressure is not limited thereto. Hereinafter, an example in which the planar shape of the convex portion of the insulating layer is different from the third embodiment will be described as a modified example.

Modified Example 3-1

Figure 14:
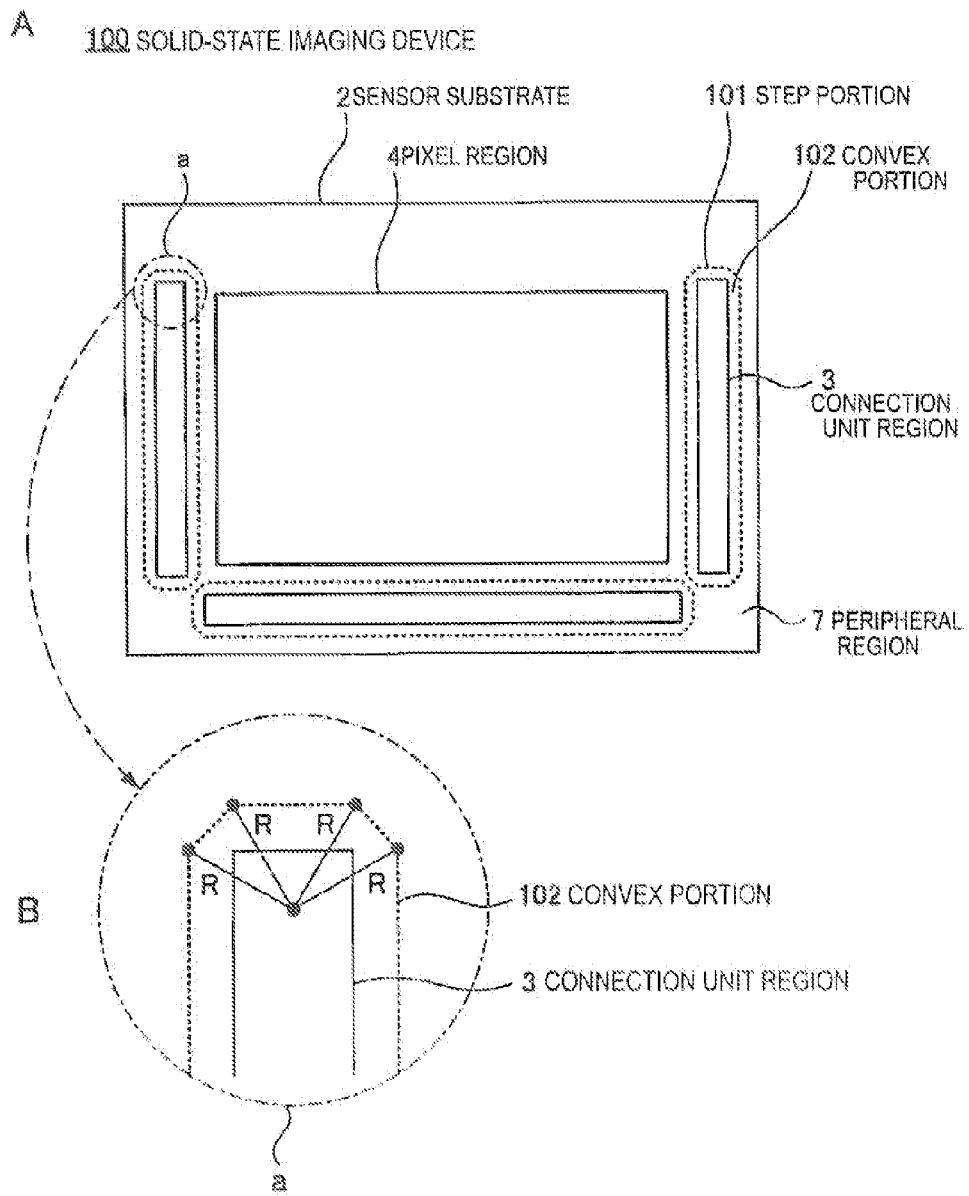
FIG. 14A is a schematic configuration diagram of a sensor substrate of a solid-state imaging device in accordance with a modified example 3-1.
FIG. 14B is an enlarged view in a region a of FIG. 14A.

FIG. 14A is a schematic configuration diagram of a sensor substrate 2 of a solid-state imaging device 100 of the modified example 3-1, and FIG. 14B is an enlarged view in a region a of FIG. 14A. Even in this embodiment, as in FIG. 1, the circuit substrate 9 is provided on a surface on the opposite side of the light receiving surface of the sensor substrate 2, and a cross-sectional configuration of the solid-state imaging device 100 is similar to that of FIG. 10 (the second embodiment). Accordingly, because cross-sectional configurations of the circuit substrate 9 and the solid-state imaging device 100 are similar to those of FIG. 10, description thereof is omitted here. In addition, parts of FIG. 14 corresponding to those of FIG. 1 are assigned the same reference signs, and redundant description thereof is omitted here.

The solid-state imaging device 100 in accordance with the modified example 3-1 is an example in which the planar shape of a convex portion 102 of the insulating layer is different from that illustrated in FIG. 11A. In the modified example 3-1, the planar shape of the convex portion 102 of the insulating layer is a shape obtained by diagonally cutting four corners of the rectangular convex portion 82 illustrated in FIG. 11A. In FIG. 14A, an example in which the four corners of the rectangular convex portion 82 illustrated in FIG. 11A are cut on surfaces of the convex portion 82 each having a tilt of 45 degrees or −45 degrees with respect to a corresponding side of the pixel region 4 is illustrated.

Here, as illustrated in FIG. 14B, it is preferable that the convex portion 102 be formed so that a curvature radius R of a circumscribed circle passing though four vertices provided on one end portion of the convex portion 102 is greater than 0.2 μm. In addition, the above-described shape may be formed by adding an end portion having four vertices to the convex portion 82 having the rectangular planar shape illustrated in FIG. 11A. In addition, the above-described shape may be formed by cutting the corner portions from the convex portion 82 having the rectangular planar shape illustrated in FIG. 11A.

Figure 15:
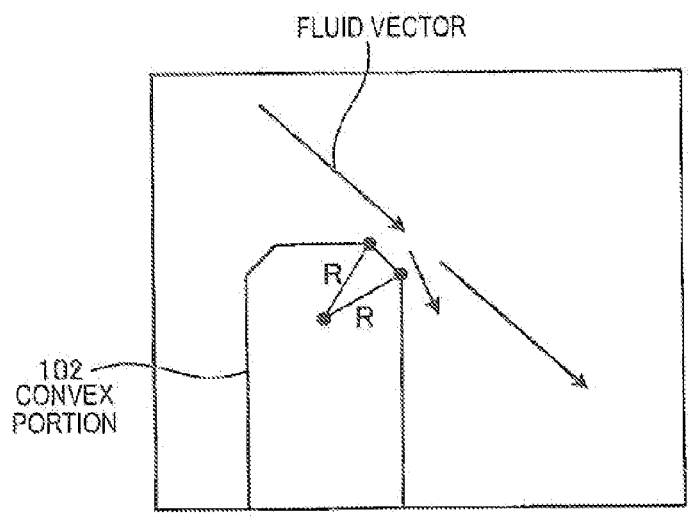
FIG. 15 is a diagram schematically illustrating results obtained by simulating a state in which an organic material flows when the organic material is coated on an upper portion of an insulating layer having a structure of the modified example 3-1.

FIG. 15 is a diagram schematically illustrating results obtained by simulating a state in which an organic material flows when the organic material is coated on an upper portion of the insulating layer having a structure of this embodiment. In FIG. 15, the arrow is a fluid vector, a direction of the arrow indicates a flow direction of the organic material coated on the upper portion of the insulating layer, and a length of the arrow indicates a flow speed of the organic material that flows in the arrow direction.

When the planar shape of the convex portion 102 of the insulating layer is substantially an arc-like corner-round rectangular shape in two end portions in a direction along a side of the pixel region 4 even in the modified example 3-1 as illustrated in FIG. 15, a local increase in the fluid pressure of the organic material flowing on the insulating layer is reduced. Thus, for a fluid flowing toward the substantially arc-like end portion of the convex portion 102, dispersion of a flow speed vector having the end portion of the convex portion 102 as the starting point is mitigated. Thereby, uneven coating of the organic material is reduced.

As described above, it is possible to have an effect similar to that of the third embodiment by increasing the number of vertices of the planar shape of each end portion in two end portions of the convex portion 102 and making the shape close to the circular arc shape from the rectangular shape. Although four vertices are formed in each end portion of the convex portion 102 in this embodiment, it is only necessary to form three or more vertices in each end portion, and the shape of each end portion of the convex portion may be a triangular or more complex polygonal shape. That is, when the number of vertices in each end portion of the convex portion is three or more and an inner angle of each vertex is greater than 90 degrees in the present disclosure, the shape is defined as "substantially a (circular) arc shape."

Modified Example 3-2

Figure 16:
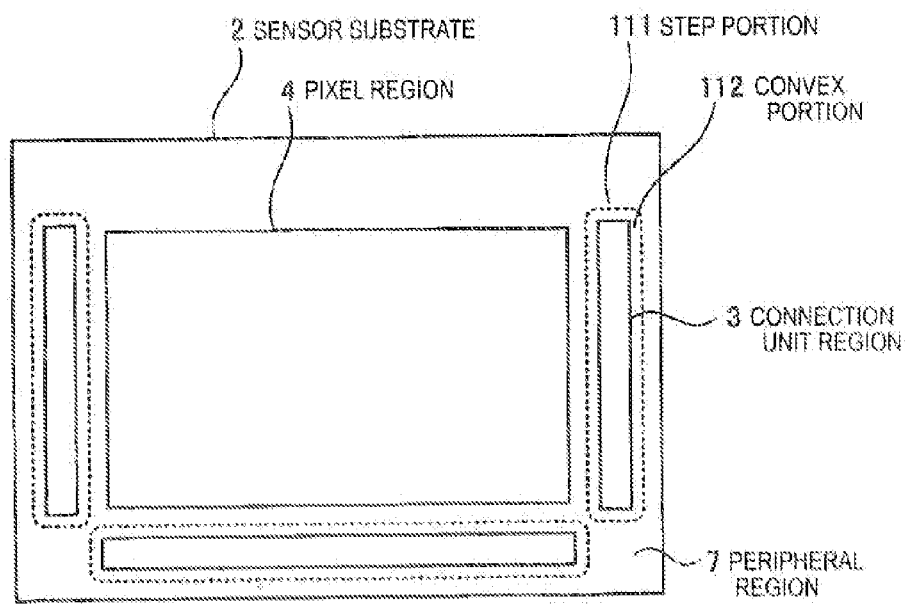
FIG. 16 is a schematic configuration diagram of a sensor substrate of a solid-state imaging device in accordance with a modified example 3-2.

FIG. 16 is a schematic configuration diagram of a sensor substrate 2 of a solid-state imaging device 110 in accordance with the modified example 3-2. Even in this embodiment, as in FIG. 1 (the first embodiment), the circuit substrate 9 is provided on a surface on the opposite side of the light receiving surface of the sensor substrate 2, and a cross-sectional configuration of the solid-state imaging device 110 is similar to that of FIG. 10. Accordingly, because cross-sectional configurations of the circuit substrate 9 and the solid-state imaging device 110 are similar to those of FIG. 10, description thereof is omitted here. In addition, parts of FIG. 16 corresponding to those of FIG. 1 are assigned the same reference signs, and redundant description thereof is omitted here.

The solid-state imaging device 110 in accordance with the modified example 3-2 is an example in which the planar shape of the convex portion 112 of the insulating layer is different from that illustrated in FIG. 11A. In the modified example 3-2, the planar shape of the convex portion 112 of the insulating layer is an arc-like corner-round rectangular shape in two end portions orthogonal to a direction along a corresponding side of the pixel region 4. However, although the two end portions of the convex portion 92 have a circular arc shape in the above-described third embodiment, the planar shape of only the corner portion on a diagonal line is the circular arc shape and facing sides of the two end portions of a convex portion 112 are formed parallel to each other in the modified example 3-2.

Even in the modified example 3-2, it is possible to have an effect similar to that of the third embodiment. As described above, in the planar shape of the convex portion, the two end portions may have not only a circular arc shape, but also a corner-round rectangular shape in which part has a circular arc shape.

In addition, although not illustrated, the planar shape of each end portion of the convex portion may be an elliptic arc shape. That is, the shape of each end portion of the convex portion is not limited to the circular arc shape. As long as the planar shape of each end portion of the convex portion is an arc shape or substantially an arc shape, it is possible to have an effect similar to that of the third embodiment.

Incidentally, the cross-sectional configurations in the third embodiment and the modified examples 3-1 and 3-2 have been described as being similar to those of FIG. 10 (the second embodiment). However, when the planar shape of the convex portion of the insulating layer is the corner-round rectangular shape, it is possible to have the effect of mitigating uneven coating to a certain extent even when the step portion of the insulating layer is formed in a tapered shape. That is, even when the surface of the step portion of the insulating layer is provided perpendicular to the light receiving surface, the uneven coating can be mitigated by setting the planar shape of the convex portion of the insulating layer to the corner-round rectangular shape.

Therefore, it is possible to apply one of a configuration in which the step portion of the insulating layer is formed in the tapered shape and a configuration in which the planar shape of the convex portion of the insulating layer is the corner-round rectangular shape. When the step portion of the insulating layer is formed in the tapered shape and the planar shape of the convex shape of the insulating layer is the corner-round rectangular shape as in the third embodiment, the modified example 3-1, and the modified example 3-2 described above, it is possible to further improve the effect of suppressing uneven coating.

The present disclosure is not limited to an application to a solid-state imaging device that senses a distribution of an incident light amount of visible light and images the sensed distribution as an image, and can also be applied to a solid-state imaging device that images a distribution of an incident amount of infrared rays, X rays, particles, or the like as an image.

Further, the present disclosure is not limited to a solid-state imaging device that sequentially scans unit pixels of a pixel region in units of rows and reads pixel signals from the unit pixels. The present disclosure can be applied to an X-Y address type solid-state imaging device that selects arbitrary pixels in units of pixels and reads signals from the selected pixels in units of pixels. The solid-state imaging device may be formed in one chip, and may be a module-like form having an imaging function packaged by integrating a pixel section and a signal processing section or an optical system.

In addition, the present disclosure is not limited to an application to the solid-state imaging device, and can also be applied to an imaging device. Here, the imaging device refers to a camera system such as a digital still camera or a digital video camera or an electronic device having an imaging function such as a portable phone. The module-like form mounted on the electronic device, that is, a camera module, may be the imaging device.

4. Fourth Embodiment

Apparatus for Manufacturing Semiconductor Device

Here, various technologies relating to bonding of a sensor substrate and a circuit substrate are known (see Japanese Unexamined Patent Application Publication No. 2010-245506, Japanese Unexamined Patent Application Publication No. 2000-348992, Japanese Unexamined Patent Application Publication No. 2012-19209, Japanese Unexamined Patent Application Publication No. 2009-49066, Japanese Unexamined Patent Application Publication No. 2010-135836, Japanese Unexamined Patent Application Publication No. H07-066093, Japanese Unexamined Patent Application Publication No. H07-94675, Japanese Unexamined Patent Application Publication No. H02-267951, and Japanese Unexamined Patent Application Publication No. 2011-205074).

In Japanese Unexamined Patent Application Publication No. 2010-245506, a method of avoiding the occurrence of a bubble (hereinafter referred to as "void") between two substrates by deforming one wafer (having the same meaning as "substrate") in a convex shape and bonding center portions of two wafers in contact with each other is disclosed. In addition, in Japanese Unexamined Patent Application Publication No. 2000-348992, a method of avoiding the occurrence of a void by deforming two wafers in convex shapes and bonding the two wafers is disclosed.

In Japanese Unexamined Patent Application Publication No. 2012-19209, a method of controlling and bonding wafers in a warpage state of predetermined curvature so as to compensate for an initial radial direction misalignment between two wafers to be bonded is disclosed. In Japanese Unexamined Patent Application Publication No. 2009-49066 and Japanese Unexamined Patent Application Publication No. 2010-135836, a method of aligning positions of two wafers in a state in which each of two chucks is caused to suction the wafer in a flat shape and then bonding the upper and lower wafers in contact with each other so as to suppress a misalignment of the bonding is disclosed.

In Japanese Unexamined Patent Application Publication No. H07-066093, a method of causing a chuck having a suction surface, which is bent to prevent the occurrence of a void, to suction one wafer and sequentially releasing a state of suction from the center to the outside of the wafer when the one wafer is bonded to the other wafer controlled in a flat shape is disclosed. In Japanese Unexamined Patent Application Publication No. H07-94675, a method of causing two chucks, each having a suction surface which is bent to prevent the occurrence of a void, to suction wafers and sequentially releasing a state of suction from the center to the outside of the wafer when two wafers are bonded is disclosed.

In Japanese Unexamined Patent Application Publication No. H02-267951, a method of bonding points serving as the same position at the same pressure from both sides after overlapping two wafers so as to prevent warpage of the wafer that may occur during bonding is disclosed. In Japanese Unexamined Patent Application Publication No. 2011-205074, a method of determining whether the bonding of the two wafers progresses normally using an infrared camera is disclosed. In Japanese Unexamined Patent Application Publication No. 2011-205074, a configuration in which a stage for holding a wafer or the like is formed of a material capable of easily transmitting infrared rays is also disclosed.

However, it is difficult for the above-described bonding methods of the related art to effectively solve all of the misalignment of bonding of two wafers, the distortion or deformation of the two wafers, and the occurrence of a void during bonding.

The present technology has been made in view of the above-described circumstances and it is desirable to provide an apparatus for manufacturing a semiconductor device and a method of manufacturing a semiconductor device that can effectively prevent the misalignment of bonding of two wafers, the distortion or deformation of the two wafers, and the occurrence of a void during bonding when the two wafers are bonded.

Figure 17:
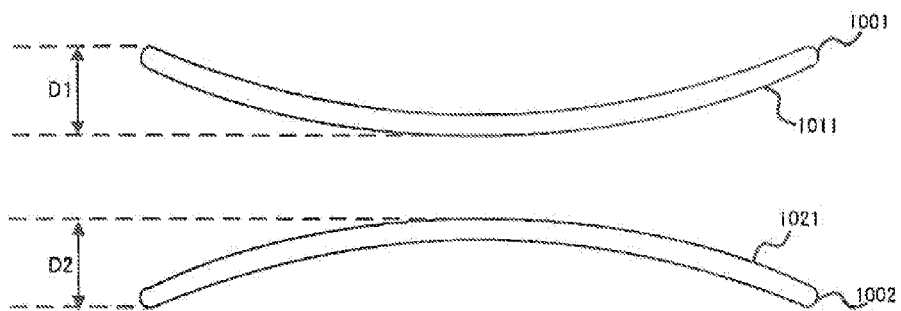
FIG. 17 is a diagram illustrating an example of two wafers to be bonded in accordance with the present technology.

Hereinafter, the fourth embodiment of the present technology will be described. FIG. 17 is a diagram illustrating an example of two wafers of a bonding target in accordance with the present technology.

In FIG. 17, a sensor wafer (hereinafter also referred to as "first substrate") 1001 is a wafer serving as a sensor substrate on which a solid-state imaging element constituting a laminated back-surface illuminated sensor is formed. A circuit wafer (hereinafter also referred to as "second substrate") 1002 is a wafer serving as a sensor substrate on which a logic circuit constituting a laminated back-surface illuminated sensor is formed. Also, in FIG. 17, end surfaces of a first substrate 1001 and a second substrate 1002 each having a bowl shape are simplified and illustrated.

In the first substrate 1001 and the second substrate 1002 described above, a surface 1011 of the first substrate 1001 and a surface 1021 of the second substrate 1002 are bonded. Also, the bonding may also be referred to as joining. In addition, the first substrate 1001 and the second substrate 1002 are not respectively limited to the sensor substrate and the circuit substrate constituting the laminated back-surface illuminated sensor. For example, both the first substrate 1001 and the second substrate 1002 may be the circuit substrates. In addition, for example, the first substrate 1001 and the second substrate 1002 may be two substrates constituting a sensor other than the laminated back-surface illuminated sensor.

The first substrate 1001 and the second substrate 1002 have convex surface shapes warped by predetermined warpage amounts D1 and D2, respectively. In addition, both the first substrate 1001 and the second substrate 1002 have shapes for causing the surfaces 1011 and 1021, each having a convex shape, that is, a convex surface, toward the other wafer, to face each other.

It is desirable that the warpage amounts D1 and D2 be substantially the same and be less than or equal to 150 μm. Also, the warpage amounts D1 and D2 of the first substrate 1001 and the second substrate 1002, for example, are controlled to be desired warpage amounts by forming a silicon nitride film on a front surface or a back surface of each of the first substrate 1001 and the second substrate 1002 and changing a film formation amount of the silicon nitride film. A method of controlling a wafer warpage amount is substantially the same even in a first substrate 1001A and a second substrate 1002A illustrated in FIG. 18A and a first substrate 1001B and a second substrate 1002B illustrated in FIG. 18B as will be described later.

Both the first substrate 1001 and the second substrate 1002 have the convex shapes toward the other wafers so as to suppress the occurrence of a void by simultaneous contact of a plurality of positions during bonding. In addition, the warpage amount D1 and the warpage amount D2 are set to the same degree so as to suppress a radial direction misalignment between the first substrate 1001 and the second substrate 1002 during bonding.

However, when an accuracy of the radial direction misalignment is satisfied, the warpage amounts of the first substrate 1001 and the second substrate 1002 may not be set to the same degree. For example, the warpage amounts may be combined as illustrated in FIGS. 18A and 18B.

Figure 18A:
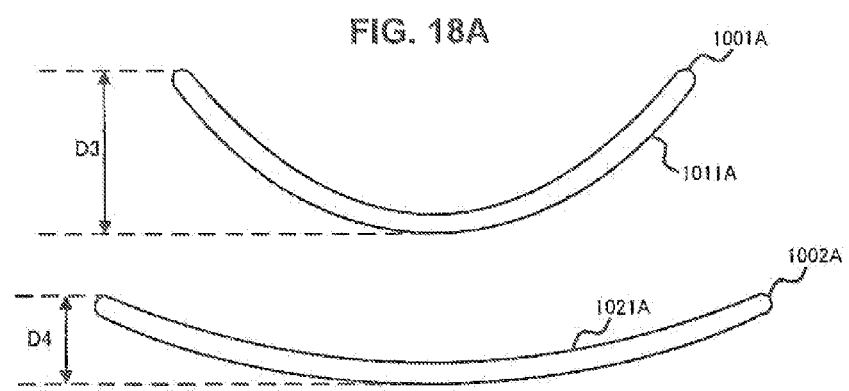
FIG. 18A is a diagram illustrating a first modified example of two wafers to be bonded in accordance with the present technology.
Figure 18B:
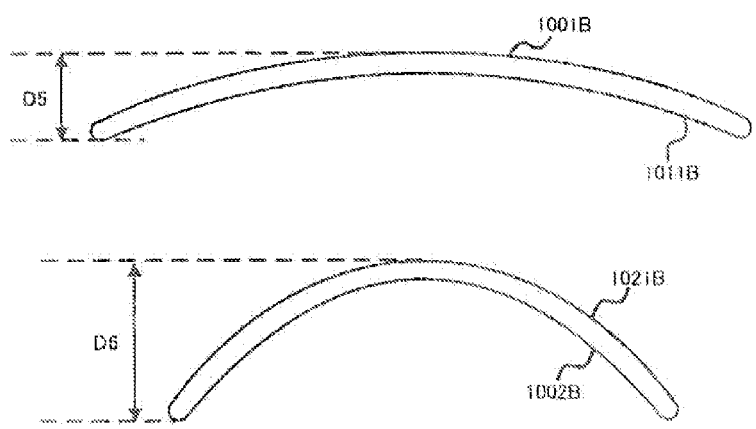
FIG. 18B is a diagram illustrating a second modified example of two wafers to be bonded in accordance with the present technology.

FIG. 18A is a diagram illustrating a modified example 4-1 of two wafers of a bonding target in accordance with the present technology. FIG. 18B is a diagram illustrating a modified example 4-2 of two wafers of a bonding target in accordance with the present technology.

In FIG. 18A, the first substrate 1001A is a wafer serving as a sensor substrate on which the solid-state imaging element is formed. The second substrate 1002A is a wafer serving as a circuit substrate on which a logic circuit is formed. In the first substrate 1001A and the second substrate 1002A described above, a surface 1011A of the first substrate 1001A and a surface 1021A of the second substrate 1002A are bonded.

The first substrate 1001A illustrated in FIG. 18A has a convex shape toward the second substrate 1002A. On the other hand, the second substrate 1002A is a concave shape toward the first substrate 1001A. In addition, the warpage amount D3 of the first substrate 1001A is greater than a warpage amount D4 of the second substrate 1002A. It is desirable that the warpage amounts D3 and D4 be less than or equal to 150 μm.

Both the first substrate 1001A and the second substrate 1002A have convex shapes in a downward direction, and the warpage amount D3 is greater than the warpage amount D4. Thus, a distance between the first substrate 1001A and the second substrate 1002A from the center to the outside of the wafer becomes longer. Thereby, when the first substrate 1001A and the second substrate 1002A are bonded, it is possible to suppress the occurrence of a void by simultaneous contact of a plurality of positions.

Also, because the warpage amount D3 of the first substrate 1001A is large, a force to bend the first substrate 1001A is necessary to bond the first substrate 1001A and the second substrate 1002A. Therefore, stable bonding is possible by adopting a joint condition in which a joint strength between the first substrate 1001A and the second substrate 1002A is strong. The above-described joint condition, for example, is a condition that increases a plasma irradiation time to activate the surface 1011A of the first substrate 1001A and the surface 1021A of the second substrate 1002A or the like in the step before bonding.

On the other hand, in FIG. 18B, the first substrate 1001B is a wafer serving as a sensor substrate on which the solid-state imaging element is formed. The second substrate 1002B is a wafer serving as a circuit substrate on which a logic circuit is formed. In the first substrate 1001B and the second substrate 1002B described above, a surface 1011B of the first substrate 1001B and a surface 1021B of the second substrate 1002B are bonded.

The second substrate 1002B illustrated in FIG. 18B has a convex shape toward the first substrate 1001B. On the other hand, the first substrate 1001B is a concave shape toward the second substrate 1002B. In addition, a warpage amount D6 of the second substrate 1002B is greater than a warpage amount D5 of the first substrate 1001B. It is desirable that the warpage amounts D5 and D6 be less than or equal to 150 μm.

Both the first substrate 1001B and the second substrate 1002B have convex shapes in a downward direction, and the warpage amount D6 is greater than the warpage amount D5. Thus, a distance between the first substrate 1001B and the second substrate 1002B from the center to the outside of the wafer becomes longer. Thereby, when the first substrate 1001B and the second substrate 1002B are bonded, it is possible to suppress the occurrence of a void by simultaneous contact of a plurality of positions.

Also, because the warpage amount D6 of the second substrate 1002B is large, a force to bend the second substrate 1002B is necessary to bond the first substrate 1001B and the second substrate 1002B. Therefore, stable bonding is possible by adopting a joint condition in which a joint strength between the first substrate 1001B and the second substrate 1002B is strong as in the first substrate 1001A and the second substrate 1002A of FIG. 18A.

[Wafer Suction Mechanism]

Figure 19:
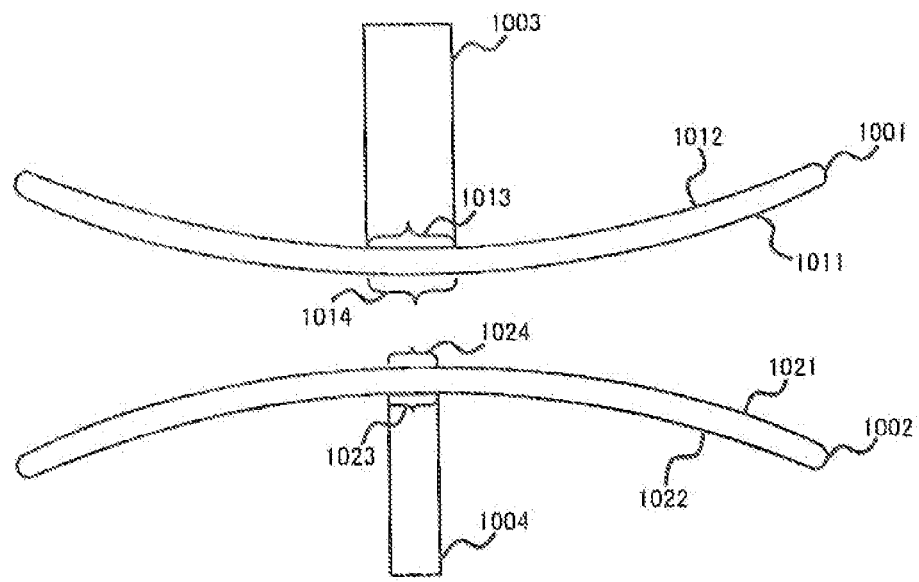
FIG. 19 is a diagram illustrating an outline of chucks that suction two wafers in accordance with the present technology.

FIG. 19 is a diagram illustrating an outline of chucks that suction two wafers in accordance with the present technology. Here, a sensor substrate chuck (hereinafter also referred to as "first chuck") 1003 that suctions the first substrate 1001 of FIG. 17 and a circuit substrate chuck (hereinafter also referred to as "second chuck") 1004 that suctions the second substrate 1002 will be described. The first chuck 1003 and the second chuck 1004 are simplified and illustrated in FIG. 19.

The first chuck 1003 is a longitudinally long cylindrical suction section that detachably suctions the back surface 1012 of the first substrate 1001. A diameter of a lower surface of the first chuck 1003, for example, is 1.4 mm. On the other hand, the second chuck 1004 is a longitudinally long cylindrical suction section that detachably suctions the back surface 1022 of the second substrate 1002. A diameter of a lower surface of the first chuck 1004 is less than the diameter of the lower surface of the first chuck 1003, and, for example, is 1 mm. Details of the first chuck 1003 and the second chuck 1004 will be described later using FIG. 20.

The first chuck 1003 suctions a suction region 1013 in a partial region of approximately the center of the back surface 1012 of the first substrate 1001. On the other hand, the second chuck 1004 suctions a suction region 1023 as a partial region of approximately the center of the back surface 1022 of the second substrate 1002.

Also, the warpages of the first substrate 1001 and the second substrate 1002 are controlled to have desired warpage amounts as described above, and hence a region 1014 on the opposite side of the suction region 1013 is initially in contact with a region 1024 on the opposite side of the suction region 1023 during bonding. The same is also true for the first substrate 1001A and the second substrate 1002A illustrated in FIG. 18A and the first substrate 1001B and the second substrate 1002B illustrated in FIG. 18B.

As described above, the first chuck 1003 suctions the first substrate 1001 only in the suction region 1013. Likewise, the second chuck 1004 suctions the second substrate 1002 only in the suction region 1023. Thus, the external force to deform the first substrate 1001 and the second substrate 1002 can be small and the distortions or misalignments of the first substrate 1001 and the second substrate 1002 can be reduced. In addition, because both a contact area between the first chuck 1003 and the first substrate 1001 and a contact area between the second chuck 1004 and the second substrate 1002 are small, it is possible to prevent the occurrence of the distortions or misalignments of the first substrate 1001 and the second substrate 1002 due to the introduction of foreign matters.

In addition, in a region other than the suction region 1013, the first substrate 1001 is not in contact with the first chuck 1003, that is, is not subjected to the external force from the first chuck 1003. Thus, when the suction by the first chuck 1003 has been released, the first substrate 1001 attempting to return to an original warpage is subjected to the external force from the first chuck 1003 and hence it is possible to prevent the distortion or misalignment from occurring. The same is also true for the second substrate 1002.

In addition, a contact area between the first chuck 1003 and the first substrate 1001, that is, an area of the suction region 1013, is larger than a contact area between the second chuck 1004 and the second substrate 1002, that is, an area of the suction region 1023. Further, when viewed in a vertical direction of FIG. 19, that is, in a bonding direction, the area of one suction region 1023 is included in the area of the other suction region 1013.

A difference between the area of the suction region 1013 and the area of the suction region 1023 described above is intended to absorb an error relating to conveyance of the first substrate 1001 and the second substrate 1002 or a positioning error during pre-alignment of the first substrate 1001 and the second substrate 1002. That is, even when a suction position of the first substrate 1001 by the first chuck 1003 and a suction position of the second substrate 1002 by the second chuck 1004 are misaligned according to these errors, the second chuck 1004 having a small contact area is fit to a position corresponding to the first chuck 1003 having a large contact area. The pre-alignment used here indicates preliminary positioning of a wafer to be executed in the step before the wafer is suctioned by the chuck.

Thereby, it is possible to remove the influence of the conveyance error of the first substrate 1001 and the second substrate 1002 or the positioning error during the pre-alignment. In addition, it is possible to prevent a force tilting the first substrate or the second substrate from occurring during bonding. Also, it is desirable that a radius of the suction region 1013 be about 150 µm longer than a radius of the suction region 1023.

[Configuration of Chuck]

Figure 20:
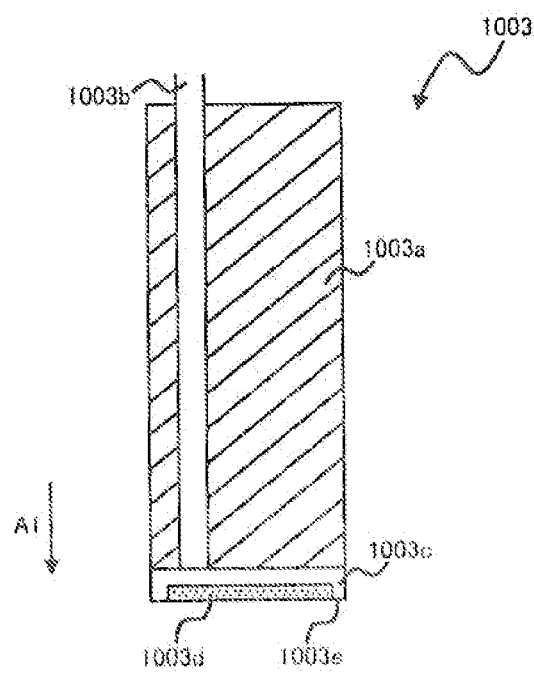
FIG. 20 is a diagram illustrating a configuration example of a chuck in accordance with a fourth embodiment of the present technology.

FIG. 20 is a diagram illustrating a configuration example of a chuck in accordance with this embodiment of the present technology. In FIG. 20, a pressing direction of the first chuck 1003 of FIG. 19 and a schematic cross-sectional view taken in the direction of an arrow A1 of the drawing are illustrated.

Hereinafter, although an example of a detailed configuration of the first chuck 1003 will be described using FIG. 20, the same is also true for the second chuck 1004.

The first chuck 1003 illustrated in FIG. 20 is approximately a cylindrical structure having a chuck main body 1003a, a suction pipe 1003b, a suction portion 1003c, and a pressing portion 1003d.

The chuck main body 1003a, for example, is formed of a material having sufficient rigidity such as a resin, hard metal, or the like. The suction pipe 1003b is formed by a vertical hole provided by drilling inside the chuck main body 1003a, and connected to an external suction device (not illustrated). A lower end of the suction pipe 1003b is communicated with the suction portion 1003c.

The suction portion 1003c is a mesh-like layer-like (plate-like) member, and is provided on a lower bottom surface of the chuck main body 1003a. The suction portion 1003c, for example, is a porous plate manufactured by forming a hole in a layer formed of a material such as a ceramic.

The pressing portion 1003d is provided on the surface of the pressing surface 1003e of the suction portion 1003c. In order to secure and maintain the parallelism of the pressing surface 1003e, the pressing portion 1003d, for example, is formed of a material with sufficient rigidity such as a metal, a resin, or a ceramic. Also, in the example illustrated in FIG. 20, the suction portion 1003c and the pressing portion 1003d are formed so that the suction pipe 1003b is exposed on part of the pressing surface 1003e.

When the first chuck 1003 illustrated in FIG. 20 is in contact with the first substrate 1001, only a partial region of the first substrate 1001 is suctioned by performing vacuum suction on the first substrate 1001 via the suction pipe 1003b and the suction portion 1003c. Therefore, the suction force of the vacuum suction is appropriately adjusted so that the suction force occurring between the first chuck 1003 and the first substrate 1001 is greater than or equal to a misalignment force between the first substrate 1001 and the second substrate 1002 during temporary joining.

Although an example of a detailed configuration of the first chuck 1003 has been described using FIG. 20, the detailed configuration of the first chuck 1003 is not limited to the configuration illustrated in FIG. 20 as long as only a partial region of the first substrate 1001 can be suctioned.

[Apparatus for Manufacturing Semiconductor Device]

Figure 21:
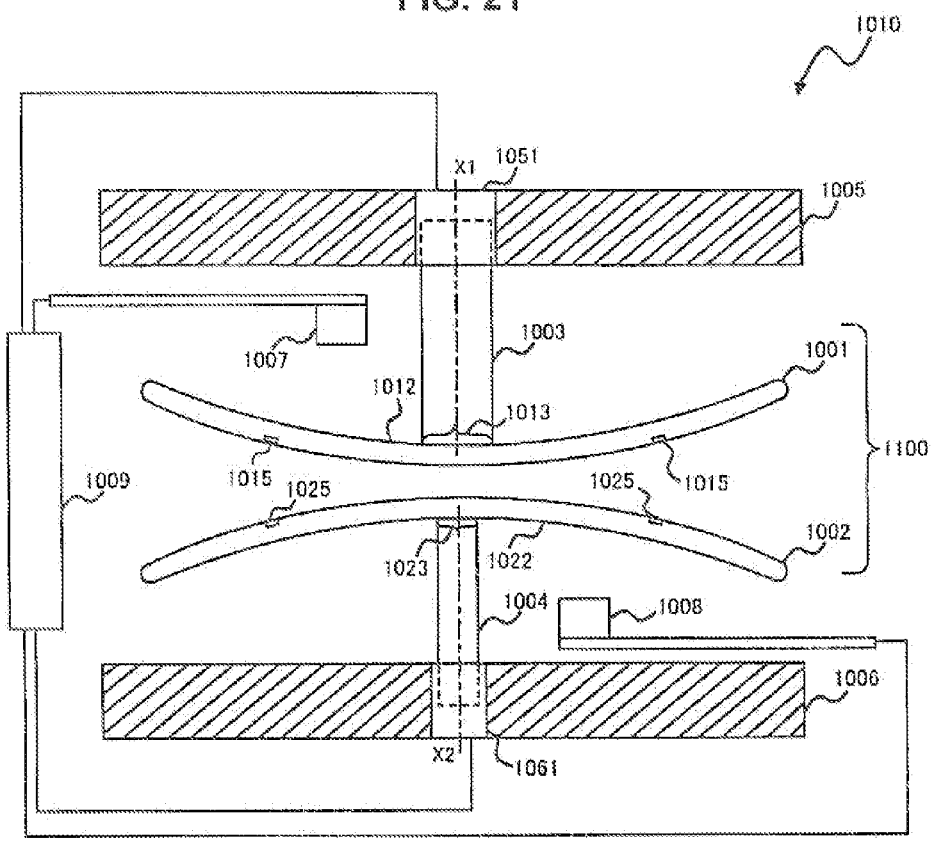
FIG. 21 is a diagram illustrating an apparatus for manufacturing a semiconductor device in accordance with the fourth embodiment of the present technology.

FIG. 21 is a diagram illustrating the apparatus for manufacturing the semiconductor device in accordance with the fourth embodiment of the present technology. The semiconductor device used here is a laminated back-surface illuminated sensor manufactured based on a semiconductor substrate 1100 formed by bonding a first substrate 1001 and a second substrate 1002. In FIG. 21, a schematic cross-sectional view taken in a bonding direction of the manufacturing apparatus 1010 is illustrated.

The manufacturing apparatus 1010 illustrated in FIG. 21 includes a first chuck 1003, a second chuck 1004, a first chuck holding section 1005, a second chuck holding section 1006, detection sections 1007 and 1008, and a control section 1009, and is a bonding apparatus that bonds the first substrate 1001 to the second substrate 1002. Also, elements of FIG. 21 similar to those of FIG. 19 are assigned the same reference signs, and redundant description thereof is appropriately omitted from the following description of FIG. 21.

The first chuck holding section 1005 is a plate-like member with a predetermined thickness. The first chuck holding section 1005 includes a first chuck driving section 1051 for driving the first chuck 1003 to be rotatable using an axis X1 as a rotation axis and movable upward and downward along the axis X1. An operation of the first chuck driving section 1051 is controlled by the control section 1009. In addition, the first chuck holding section 1005 itself is movable in an upward/downward/left/right direction in the drawing, and its operation is also controlled by the control section 1009.

Like the first chuck holding section 1005, the second chuck holding section 1006 is a plate-like member having a predetermined thickness. The second chuck holding section 1006 includes a second chuck driving section 1061 for driving the second chuck 1004 to be rotatable using an axis X2 as a rotation axis and movable upward and downward along the axis X2. An operation of the second chuck driving section 1061 is controlled by the control section 1009. In addition, the second chuck holding section 1006 itself is movable in the upward/downward/left/right direction in the drawing, and its operation is also controlled by the control section 1009.

The detection section 1007 is provided to be movable in the upward/downward/left/right direction in the drawing in a space away from the first chuck 1003 between the first chuck holding section 1005 and the first substrate 1001. The detection section 1007 detects a plurality of alignment marks 1015 formed on the first substrate 1001. Preferably, the detection section 1007, for example, is an optical system using infrared rays such as an infrared camera or an infrared microscope.

The detection section 1008 is provided to be movable in the upward/downward/left/right direction in the drawing in a space away from the second chuck 1004 between the second chuck holding section 1006 and the second substrate 1002. The detection section 1008 detects a plurality of alignment marks 1025 formed on the second substrate 1002. Preferably, like the detection section 1007, the detection section 1008, for example, is an optical system using infrared rays such as an infrared camera or an infrared microscope.

The control section 1009 calculates state information such as a position, a height, a thickness, and a warpage amount of the first substrate 1001 based on position information regarding the alignment marks 1015 of the first substrate 1001 detected by the detection section 1007. Likewise, state information of the second substrate 1002 is calculated based on position information regarding the alignment marks 1025 of the second substrate 1002 detected by the detection section 1008. In addition, operations of the first chuck 1003, the second chuck 1004, and the like are controlled based on the obtained state information of the first substrate 1001 and the second substrate 1002. The control section 1009 includes a central processing unit (CPU), a memory, an interface section, and the like (not illustrated). A detailed operation of the control section 1009 will be described later using FIG. 22.

According to the above-described configuration, the manufacturing apparatus 1010 bonds the first substrate 1001 to the second substrate 1002. On the first substrate 1001, the plurality of alignment marks 1015 recognizable by the detection section 1007 are formed. When the detection section 1007 is an optical system using infrared rays, it is assumed that the alignment marks 1015 are formed of a metal, and a layer which shields or absorbs infrared rays in an optical path within the first substrate 1001 is removed. On the second substrate 1002, as in the first substrate 1001, the plurality of alignment marks 1025 are formed.

As described above, in the manufacturing apparatus 1010 of this embodiment, the detection sections 1007 and 1008 are provided in close proximity to the first substrate 1001 and the second substrate 1002, respectively. Thus, the manufacturing apparatus 1010 measures positions and heights of the first substrate 1001 and the second substrate 1002, and highly accurate alignment or correction on the first substrate 1001 and the second substrate 1002 is possible. In addition, the manufacturing apparatus 1010 can control bonding even when states of positions, heights, thicknesses, warpage amounts, and the like of the first substrate 1001 and the second substrate 1002 have been varied.

[Method of Manufacturing Semiconductor Device]

Figure 22:
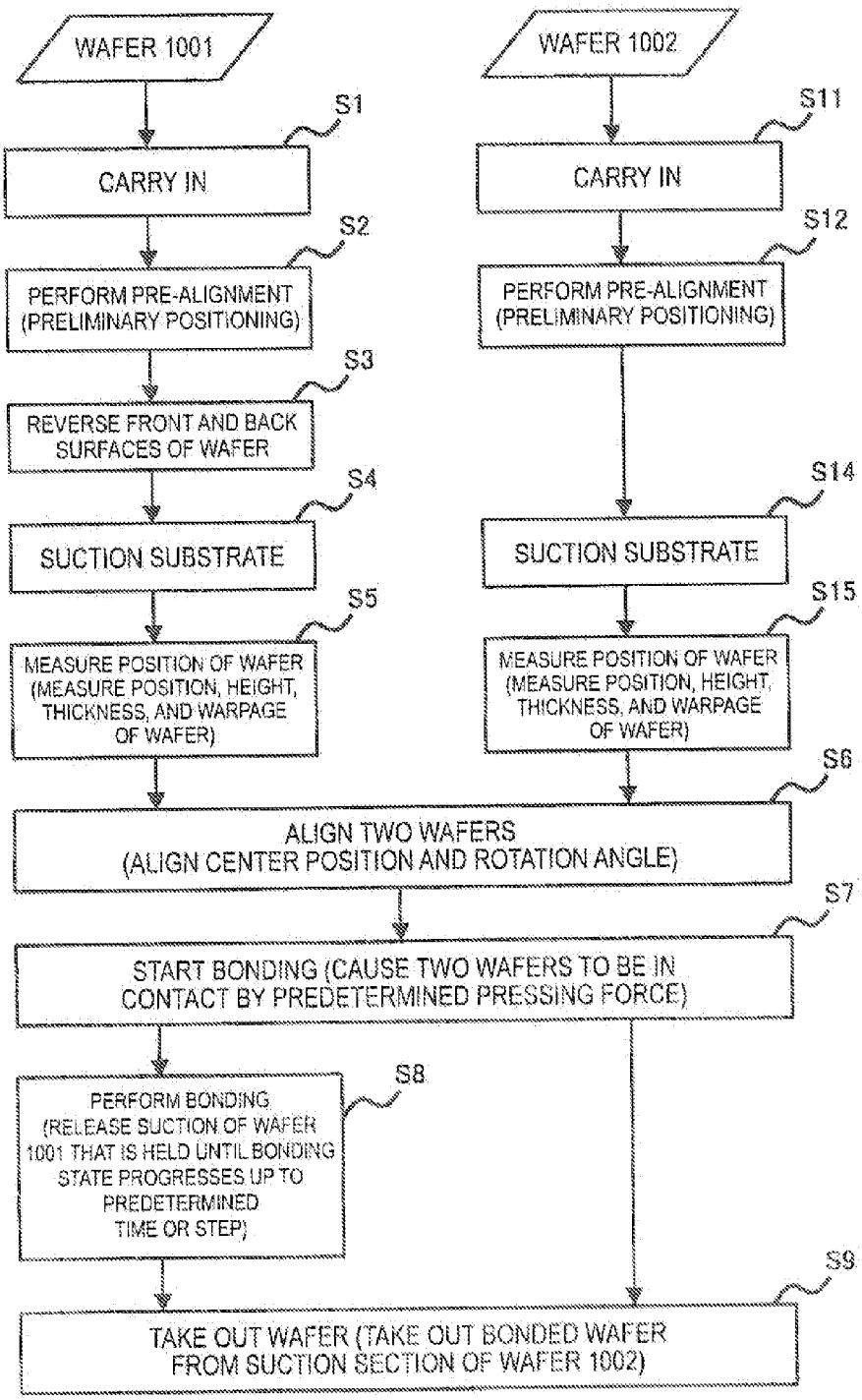
FIG. 22 is a flowchart illustrating a method of manufacturing a semiconductor device in accordance with the fourth embodiment of the present technology.

FIG. 22 is a flowchart illustrating the method of manufacturing the semiconductor device in accordance with the fourth embodiment of the present technology. Also, a method of bonding the first substrate 1001 to the second substrate 1002 in a method of manufacturing a desired semiconductor device based on the first substrate 1001 and the second substrate 1002 will be described with reference to FIG. 22, First, in steps 1 and 11, the manufacturing apparatus 1010 perform carrying-in of the first substrate 1001 and the second substrate 1002 (S1 and S11). Here, a carrying-in device (not illustrated) carries the first substrate 1001 and the second substrate 1002 into the manufacturing apparatus 1010. Also, the first substrate 1001 is carried in by reversing the front and back surfaces from the form illustrated in FIG. 17. On the other hand, the second substrate 1002 is directly carried in in the form illustrated in FIG. 17. That is, both the first substrate 1001 and the second substrate 1002 are carried in in the convex forms in the upward direction.

Next, in steps 2 and 12, the manufacturing apparatus 1010 performs rough positioning according to pre-alignment on each of the first substrate 1001 and the second substrate 1002 (S2 and S12).

Thereafter, in step 3, the manufacturing apparatus 1010 reverses the front and back surfaces of the first substrate 1001 subjected to the pre-alignment in step 2 (S3). Thereby, both the first substrate 1001 and the second substrate 1002 are arranged in the convex forms toward the other wafers as illustrated in FIG. 21. In step 1, the first substrate 1001 is carried in in the form illustrated in FIG. 17. Also, the process of step 3 may not be executed.

Thereafter, in step 4, the manufacturing apparatus 1010 suctions the first substrate 1001 whose front and back surfaces have been reversed (S4). Specifically, the first chuck 1003 suctions the suction region 1013 of the first substrate 1001. Also, it is desirable that the suction area of the suction region 1013, for example, be approximately a circular region with a diameter of about several millimeters (mm), and be as small as possible in a range in which no misalignment occurs in each subsequent process.

On the other hand, in step 14, the manufacturing apparatus 1010 suctions the second substrate 1002 (S14). Specifically, the second chuck 1004 suctions the suction region 1023 of the second substrate 1002. In addition, it is desirable that a radius of the suction area of the suction region 1023 be about 150 μm less than that of the suction area of the suction region 1013.

Thereafter, in steps 5 and 15, the manufacturing apparatus 1010 measures positions of the first substrate 1001 and the second substrate 1002 (S5 and S15). Here, first, in a state in which the first chuck 1003 is caused to suction the suction region 1013 of the first substrate 1001, the detection section 1007 detects the alignment marks 1015 formed on the first substrate 1001. Likewise, the detection section 1008 detects the alignment marks 1025 formed on the second substrate 1002.

The above will be specifically described. In a state in which the first substrate 1001 is caused to rotate using the axis X1 as the rotation axis, the detection section 1007 detects 3D position information regarding the plurality of alignment marks 1015 formed at a plurality of positions within the surface of the first substrate 1001 from the back surface 1012 of the first substrate 1001. Here, the plurality of alignment marks 1015 will be described in further detail.

Figure 23:
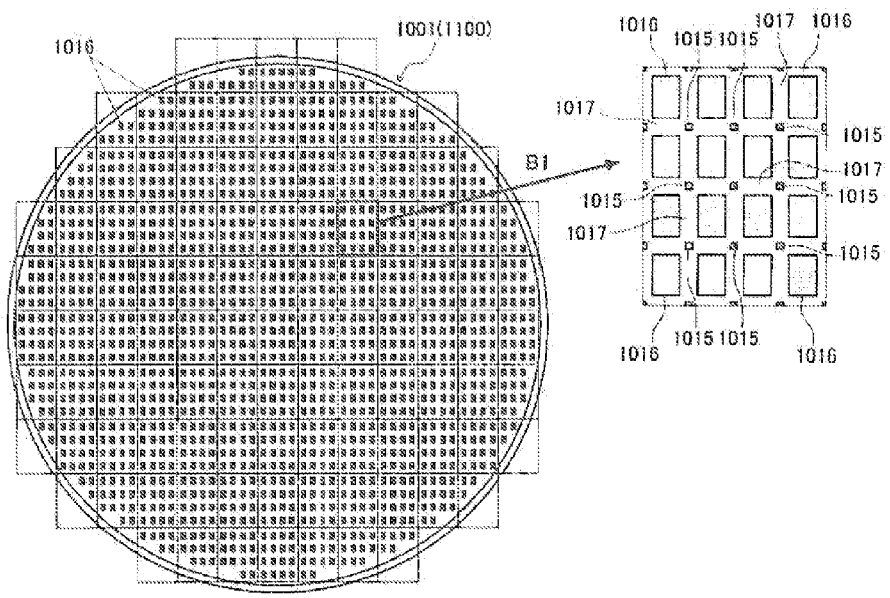
FIG. 23 is an explanatory diagram illustrating marks for misalignment measurement in accordance with the fourth embodiment of the present technology.

FIG. 23 is an explanatory diagram illustrating the alignment marks 1015 in accordance with the fourth embodiment of the present technology. Although a detailed example of the alignment marks 1015 illustrated in FIG. 21 will be described hereinafter, it is assumed that the same is also true for the alignment marks 1025.

The alignment marks 1015 are provided on a surface portion of a bonding side of the first substrate 1001 for the second substrate 1002 (see FIG. 21). As illustrated in FIG. 23, the alignment mark 1015 is arranged in a lattice point shape in a plan view of the first substrate 1001.

As illustrated in FIG. 23, in the first substrate 1001, there are a plurality of chips 1016 constituting solid-state imaging devices into which the semiconductor substrate 1100 is cut and separated and a dicing region (scribe region) 1017 in which there is a dicing line for separating the semiconductor substrate 1100 into a plurality of chips. The semiconductor substrate 1100 is cut along the dicing line in the dicing region 1017 in the dicing process, and hence the semiconductor substrate 1100 is separated into a plurality of semiconductor chips, and solid-state imaging devices are obtained.

In the first substrate 1001, the plurality of chips 1016 are regularly arranged at equal intervals in each direction in a vertical direction/horizontal direction. When the horizontal direction (left/right direction in FIG. 23) is designated as a first direction in an arrangement of the plurality of chips 1016, the vertical direction (upward/downward direction in FIG. 23) can be referred to as a second direction normal to the first direction. As illustrated in FIG. 23, the plurality of chips 1016 are provided over approximately the entire range on a plane in the first substrate 1001.

The dicing region 1017 is formed in a lattice shape in correspondence with the above-described arrangement of the plurality of chips 1016. That is, the dicing region 1017 is formed in the lattice shape according to a line portion of the horizontal direction having a width of an interval between the chips 1016 adjacent to each other in the vertical direction and a line portion of the vertical direction having a width of an interval between the chips 1016 adjacent to each other in the horizontal direction.

In the first substrate 1001 having a group of the chips 1016 regularly arranged in the vertical direction/horizontal direction and dicing regions 1017 formed in the lattice shape, it is preferable that the alignment marks 1015 be provided in a lattice-point portion in the dicing region 1017. However, it is not necessary to provide the lattice-point portion in the dicing region 1017.

In addition, it is desirable to thoroughly provide the arrangement of the alignment marks 1015 in the first substrate 1001. That is, it is desirable that the alignment marks 1015 be uniformly arranged in a relationship with the chips 1016 provided over approximately the entire range on a plane in the first substrate 1001.

As illustrated in FIG. 23, the alignment marks 1015 have a square-like external appearance in the vertical direction or the horizontal direction in which each of one facing side and the other facing side defines the arrangement of the chips 1016. Also, the alignment marks 1015, for example, may have approximately a cross-like external appearance of about 100 μm×100 μm.

The alignment marks 1015, for example, are provided by forming a metal pattern on the first substrate 1001, which is a silicon substrate. As a technique for forming the metal pattern on the first substrate 1001, for example, a well-known technique such as chemical vapor deposition (CVD) or etching is used.

The alignment marks 1015 are detected by the detection section 1007 from reflected light of infrared rays passing through the first substrate 1001. Thus, the alignment marks 1015 are provided as a portion having a reflectance ratio different from that of another portion (silicon portion) so that the detection section 1007 detects the alignment marks 1015 from the reflected light of the infrared rays.

For example, when the alignment mark 1015 is a metal pattern portion as described above, the metal portion of the alignment mark 1015 becomes a portion having a greater reflectance ratio than another portion (silicon portion). That is, because the reflected light of the infrared rays returns from the portions of the alignment marks 1015 in this case, the detection section 1007 detects the alignment marks 1015.

It is only necessary for the alignment marks 1015 to be any elements capable of being detected by the detection section 1007 from the reflected light of the infrared rays according to a reflectance ratio difference from the other portion (silicon portion) in the first substrate 1001. Therefore, the alignment marks 1015 are configured by embedding a material having a different reflectance ratio from silicon in the first substrate 1001. Here, an example of the material, which has the different reflectance ratio from the silicon, constituting the alignment marks 1015 is a metal such as Al, Cu, or W. However, the material to form the alignment marks 1015 is not limited to a metal material, and, for example, may be an oxide film or the like.

When the alignment marks 1015 are provided on the surface 1011 of the first substrate 1001 as in this embodiment, the alignment marks 1015 are formed on the first substrate 1001 at a predetermined timing while the first substrate 1001 undergoes a manufacturing process as a single body before being bonded to the second substrate 1002. Then, the first substrate 1001 on which the alignment marks 1015 are formed is bonded to the second substrate 1002 from a surface side on which the alignment marks 1015 are formed.

The detection section 1007 detects 3D position information regarding the plurality of alignment marks 1015 described above using FIG. 23 (S5 of FIG. 22).

Also, in step 5, the control section 1009 obtains shape information regarding the first substrate 1001 such as a position, a height, a thickness, and a warpage amount of the entire surface of the first substrate 1001 based on the 3D position information regarding the plurality of alignment marks 1015 detected by the detection section 1007. According to a similar method, in step 15, the control section 1009 obtains shape information regarding the second substrate 1002 such as a position, a height, a thickness, and a warpage amount of the entire surface of the second substrate 1002 based on the 3D position information regarding the plurality of alignment marks 1025 detected by the detection section 1008.

In addition, in steps 5 and 15, the control section 1009 calculates center positions and rotation angles of the first substrate 1001 and the second substrate 1002 based on the obtained shape information regarding the first substrate 1001 and the second substrate 1002. The center positions used here are positions of center portions of the first substrate 1001 and the second substrate 1002 of bowl shapes. The rotation angle is a clockwise or counterclockwise rotation angle of the first substrate 1001 or the second substrate 1002 when the center of the first substrate 1001 or the second substrate 1002 is designated as the origin. Thereafter, new positions of the first substrate 1001 and the second substrate 1002 are obtained so that the center positions and the rotation angles of the first substrate 1001 and the second substrate 1002 are aligned.

Figure 24:
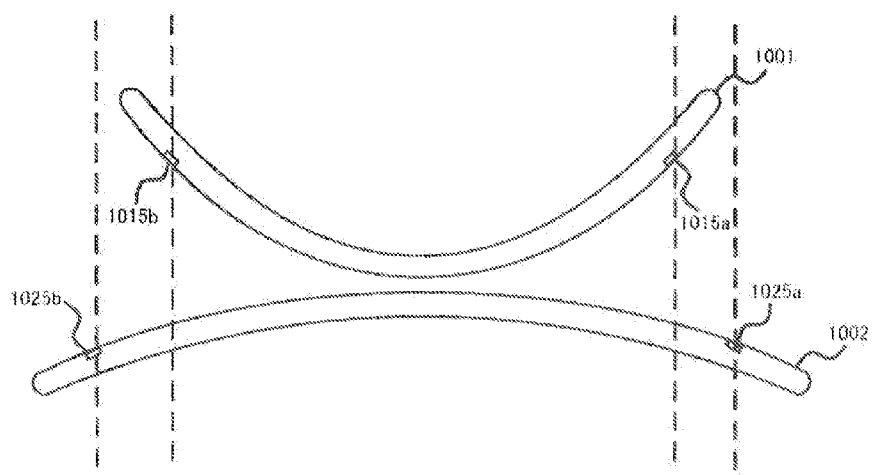
FIG. 24 is a diagram illustrating misalignment of alignment marks when warpage amounts of two wafers are different.

Also, when warpage amounts of the first substrate 1001 and the second substrate 1002 are different in steps 5 and 15, the alignment marks are misaligned as in alignment marks 1015a of the first substrate 1001 and alignment marks 1025a of the second substrate 1002 illustrated in FIG. 24.

FIG. 24 is a diagram illustrating misalignment of alignment marks when warpage amounts of two wafers are different. Even in this case, the center positions and the rotation angles of the first substrate 1001 and the second substrate 1002 are calculated based on 3D position information regarding a plurality of alignment marks 1015a, 1015b, 1025a, and 1025b formed on the first substrate 1001 and the second substrate 1002.

Thereafter, in step 6, the manufacturing apparatus 1010 aligns (positions) the first substrate 1001 and the second substrate 1002 (S6). In step 6, in a state in which the first chuck 1003 is caused to suction only the suction region 1013 of the first substrate 1001, the control section 1009 moves the first substrate 1001 to a position determined in step 5 by moving the first chuck 1003 and the first chuck holding section 1005. Likewise, in a state in which the second chuck 1004 is caused to suction only the suction region 1023 of the second substrate 1002, the control section 1009 moves the second substrate 1002 to a position determined in step 15 by moving the second chuck 1004 and the second chuck holding section 1006.

Thereafter, in step 7, the manufacturing apparatus 1010 starts bonding of the first substrate 1001 and the second substrate 1002 (S7). In step 7, a plasma irradiation device (not illustrated) radiates plasma for activating the surface 1011 of the first substrate 1001 and the surface 1012 of the second substrate 1002 before the bonding. Thereafter, the control section 1009 presses the surface 1011 of the first substrate 1001 suctioned by the first chuck 1003 against the surface 1021 of the second substrate 1002 with a predetermined pressing force, for example, a force in the order of 1 N to 50 N, by operating the first chuck driving section 1051 and the first chuck holding section 1005.

At this time, the control section 1009 controls a bonding condition based on at least one of the warpage amounts of the first substrate 1001 and the second substrate 1002 calculated in step 6 and a distance between the first substrate 1001 and the second substrate 1002. The bonding condition used here is various parameters for controlling bonding of the first substrate 1001 and the second substrate 1002, and is at least one type of relative positions of the first substrate 1001 and the second substrate 1002, a pressing force, a moving distance of a wafer thickness direction, the above-described joining conditions, and the like.

For example, when any one warpage amount of the warpage amounts of the first substrate 1001 and the second substrate 1002 calculated in step 6 is larger, a radiation time of the above-described plasma is lengthened or the pressing force is strengthened according to the warpage amount. Thereby, it is possible to improve a joining force between the first substrate 1001 and the second substrate 1002. In addition, for example, according to the warpage amounts of the first substrate 1001 and the second substrate 1002, the relative positions of the first substrate 1001 and the second substrate 1002 are corrected. In addition, for example, until a distance between the first substrate 1001 and the second substrate 1002 becomes 5 µm, the first chuck 1003 and the second chuck 1004 may move at a high speed and then the first substrate 1001 may be pressed against the second substrate 1002 with a predetermined pressing force.

Also, in step 7, the control section 1009 may press the surface 1021 of the second substrate 1002 suctioned by the second chuck 1004 against the surface 1011 of the first substrate 1001 with a predetermined pressing force, for example, a force in the order of 1 N to 50 N, by operating the second chuck driving section 1061 and the second chuck holding section 1006.

Thereafter, in step 8, the manufacturing apparatus 1010 bonds the first substrate 1001 (S8). In step 8, the control section 1009 releases suction of one of the first substrate 1001 and the second substrate 1002, here, suction by the first chuck 1003 of the first substrate 1001, after a predetermined time has elapsed or after a bonding state has progressed until a predetermined step, and causes the first chuck 1003 to be evacuated.

The predetermined step used here, for example, is the step in which approximately center portions of the first substrate 1001 and the second substrate 1002 have been bonded. In this step, an external force for the first substrate 1001 due to the suction can be reduced by releasing the suction of the first substrate 1001 by the first chuck 1003. In addition, the predetermined step, for example, is the step in which bonding of the first substrate 1001 and the second substrate 1002 has been completed. It is possible to suppress a misalignment between the first substrate 1001 and the second substrate 1002 by holding the suction of the first substrate 1001 by the first chuck 1003 until the above-described step.

Also, as means for observing the bonding state, the above-described detection sections 1007 and 1008 may be used. In addition, an infrared optical system having a larger field of view than an alignment optical system may be used. Because a state in which a bonding interface referred to as a bonding wave progresses can be observed when the first substrate 1001 and the second substrate 1002 are observed during bonding in an infrared optical system having a large field of view, it is possible to recognize the step of the bonding state.

Thereafter, in step 9, the manufacturing apparatus 1010 takes out the first substrate 1001 and the second substrate 1002 that are bonded (S9). Here, a taking-out device (not illustrated) takes out the semiconductor substrate 1100 including the first substrate 1001 and the second substrate 1002 suctioned by the second chuck 1004 and bonded to each other.

According to each process illustrated above, the first substrate 1001 and the second substrate 1002 are bonded. Also, the semiconductor substrate 1100 manufactured as described above is subjected to a subsequent process similar to that of the related art and hence a desired laminated back-surface illuminated sensor is manufactured. Also, in step 7, plasma irradiation is performed before bonding of the first substrate 1001 and the second substrate 1002. However, an application target of the present technology is not limited to bonding including the plasma irradiation process.

5. Fifth Embodiment

Apparatus for Manufacturing Semiconductor Device

Hereinafter, the fifth embodiment of the present technology will be described.

The above-described fourth embodiment has a form in which the detection section 1007 is provided between the first chuck holding section 1005 and the first substrate 1001 (see FIG. 21). Here, a form in which a detection section 1007A is provided outside the first chuck holding section 1005, that is, in a space on the opposite side of the first chuck 1003 via the first chuck holding section 1005, will be described (see FIG. 25). The same is also true for a detection section 1008A.

Figure 25:
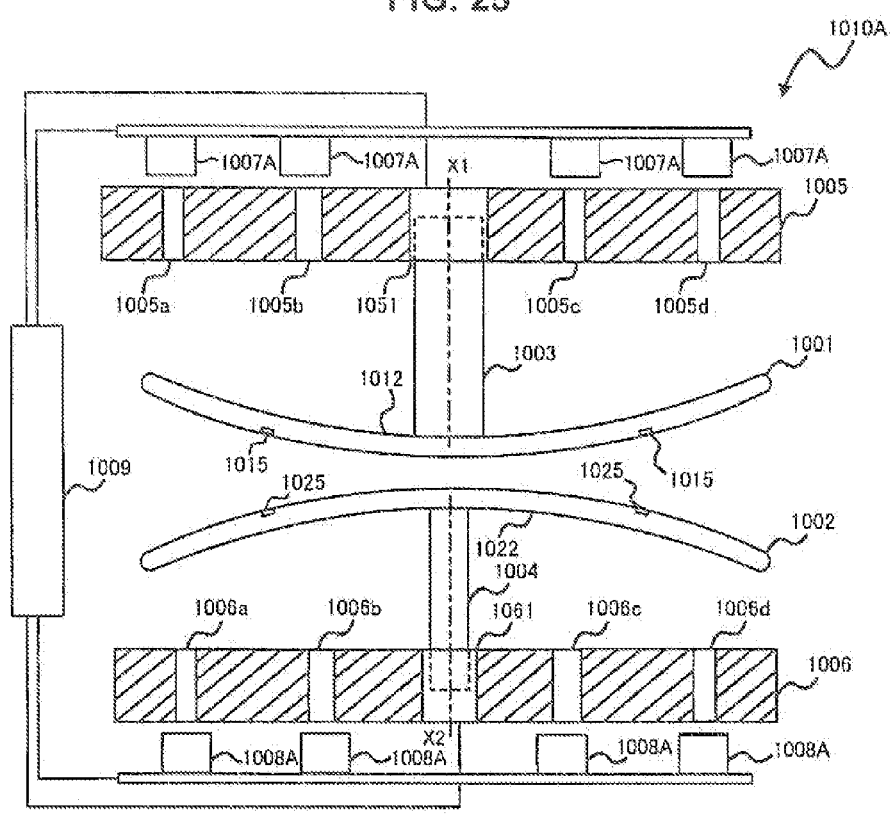
FIG. 25 is a diagram illustrating an apparatus for manufacturing a semiconductor device in accordance with a fifth embodiment of the present technology.

FIG. 25 is a diagram illustrating the apparatus for manufacturing the semiconductor device in accordance with the fifth embodiment of the present technology. Also, elements of FIG. 25 similar to those of FIG. 21 are assigned the same reference signs, and redundant description thereof is appropriately omitted from the following description of FIG. 25.

The detection section 1007A is provided to be movable in the upward/downward/left/right direction in the drawing in a space outside the first chuck holding section 1005. The detection section 1007A detects a plurality of alignment marks 1015 formed on the first substrate 1001 via a plurality of opening portions 1005a, 1005b, 1005c, and 1005d formed in the first chuck holding section 1005. Preferably, the detection section 1007A, for example, is an optical system using infrared rays such as an infrared camera or an infrared microscope.

The detection section 1008A is provided to be movable in the upward/downward/left/right direction in the drawing in a space outside the second chuck holding section 1006. The detection section 1008A detects a plurality of alignment marks 1025 formed on the second substrate 1002 via a plurality of opening portions 1006a, 1006b, 1006c, and 1006d formed in the second chuck holding section 1006. Preferably, like the detection section 1007A, the detection section 1008A, for example, is an optical system using infrared rays such as an infrared camera or an infrared microscope.

As in a manufacturing apparatus 1010A in accordance with the fifth embodiment described above, the detection sections 1007A and 1008A may be provided outside the first chuck holding section 1005 and the second chuck holding section 1006, respectively.

6. Sixth Embodiment

Apparatus for Manufacturing Semiconductor Device

Hereinafter, the sixth embodiment of the present technology will be described. The above-described fourth embodiment has a form in which the first chuck 1003 and the second chuck 1004 are provided at approximately the centers of the first chuck holding section 1005 and the second chuck holding section 1006 (see FIG. 21). Here, a form in which the first chuck 1003 and the second chuck 1004 are provided in the vicinity of end portions of the first chuck holding section 1005 and the second chuck holding section 1006, respectively, as illustrated in FIG. 26 will be described.

Figure 26:
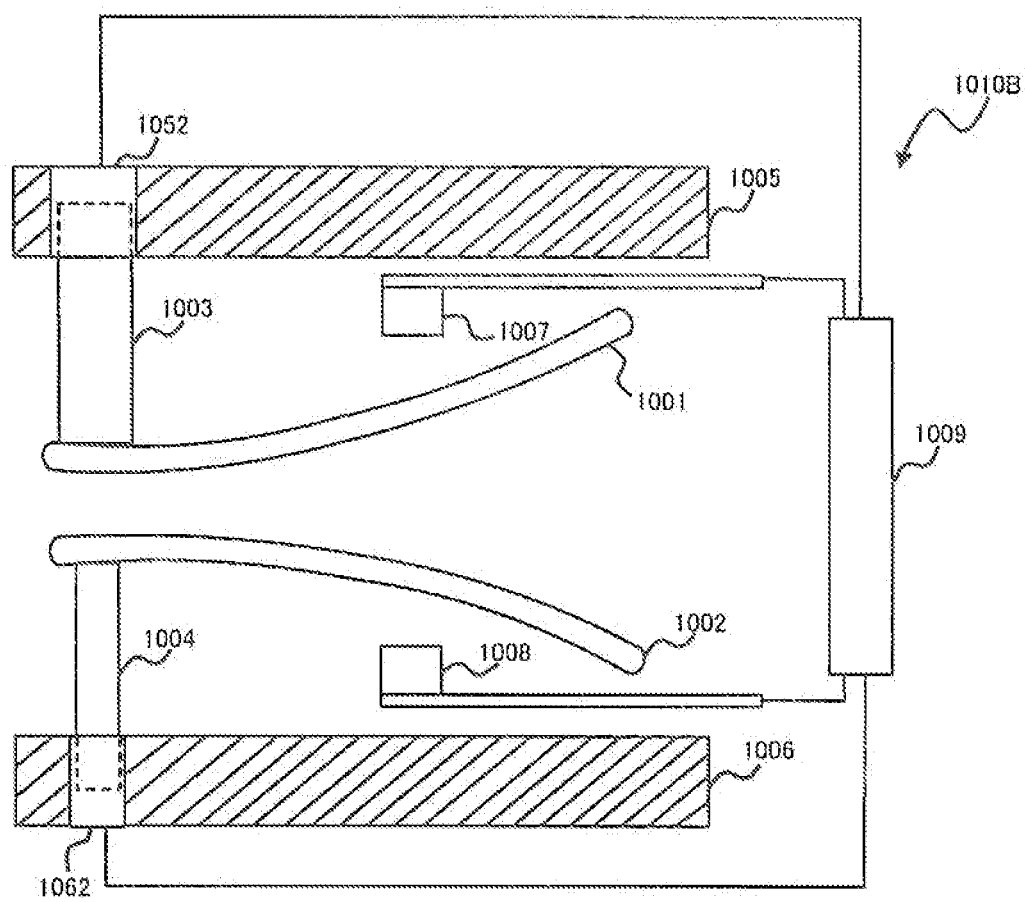
FIG. 26 is a diagram illustrating an apparatus for manufacturing a semiconductor device in accordance with a sixth embodiment of the present technology.
Figure 27:
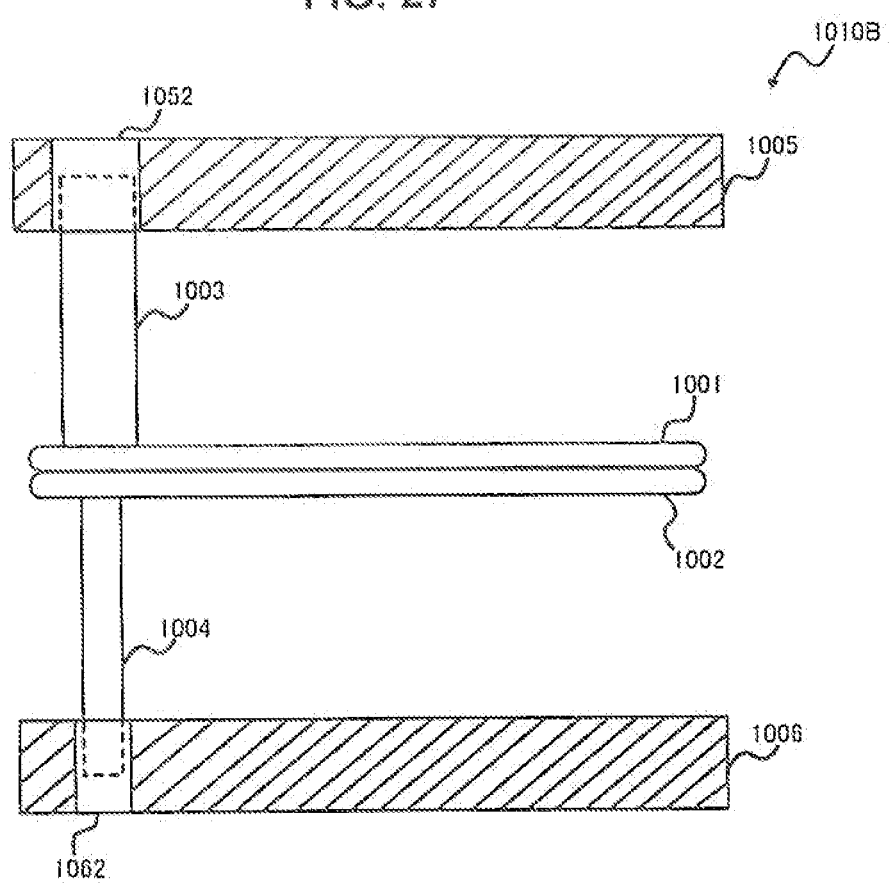
FIG. 27 is a diagram illustrating an apparatus for manufacturing a semiconductor device in accordance with the sixth embodiment of the present technology.

FIGS. 26 and 27 are diagrams illustrating the apparatus for manufacturing the semiconductor device in accordance with the sixth embodiment of the present technology. In FIGS. 26 and 27, forms before and after the first substrate 1001 and the second substrate 1002 are bonded are illustrated.

A first chuck driving section 1052 and a second chuck driving section 1062 illustrated in FIG. 26 correspond to the first chuck driving section 1051 and the second chuck driving section 1061 of FIG. 21, respectively. Here, redundant description of the above-described elements is omitted. In addition, elements similar to those of FIG. 21 are assigned the same reference signs, and redundant description thereof is omitted.

As in a manufacturing apparatus 1010B in accordance with the sixth embodiment described above, the first chuck 1003 and the second chuck 1004 may be provided in the vicinity of end portions of the first chuck holding section 1005 and the second chuck holding section 1006, respectively,

7. Seventh Embodiment

Apparatus for Manufacturing Semiconductor Device

Hereinafter, the seventh embodiment of the present technology will be described. The above-described fourth embodiment has a form in which the first chuck holding section 1005 and the second chuck holding section 1006 are installed in a horizontal direction (see FIG. 21). Here, a form in which a first chuck holding section 1005C and a second chuck holding section 1006C are installed in a vertical direction as illustrated in FIG. 28 will be described.

Figure 28:
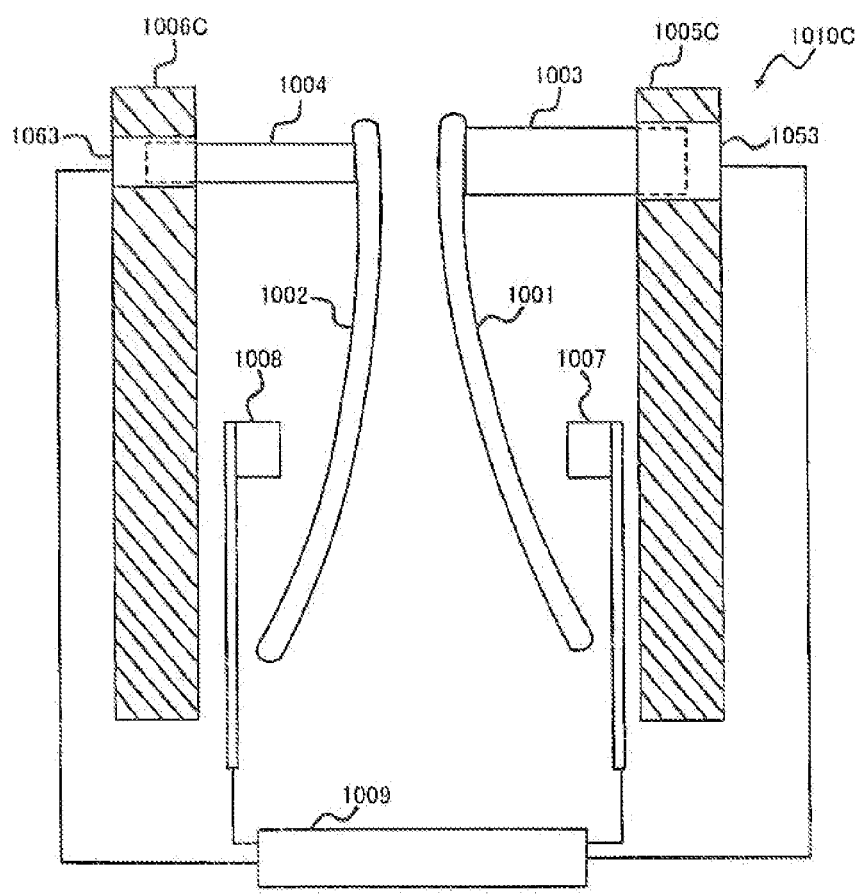
FIG. 28 is a diagram illustrating an apparatus for manufacturing a semiconductor device in accordance with a seventh embodiment of the present technology.

FIGS. 28 and 29 are diagrams illustrating the apparatus for manufacturing the semiconductor device in accordance with the seventh embodiment of the present technology. In FIGS. 28 and 29, forms before and after the first substrate 1001 and the second substrate 1002 are bonded are illustrated.

The first chuck holding section 1005C, the second chuck holding section 1006C, a first chuck driving section 1053, and a second chuck driving section 1063 illustrated in FIG. 28 correspond to the first chuck holding section 1005, the second chuck holding section 1006, the first chuck driving section 1051 and the second chuck driving section 1061 of FIG. 21, respectively. Here, redundant description of the above-described elements is omitted. In addition, elements similar to those of FIG. 21 are assigned the same reference signs, and redundant description thereof is omitted.

As in a manufacturing apparatus 1010C in accordance with the seventh embodiment described above, the first substrate 1001 and the second substrate 1002 may be vertically placed, and the first chuck 1003 and the second chuck 1004 may be arranged in the vicinity of end portions in vertically upward directions of the first chuck holding section 1005C and the second chuck holding section 1006C, respectively. Thereby, it is possible to suppress deflections, that is, changes in warpage amounts, due to self weights of the first substrate 1001 and the second substrate 1002, and to suppress misalignments due to the self weights of the first substrate 1001 and the second substrate 1002.

According to the apparatus for manufacturing the semiconductor device and the method of manufacturing the semiconductor device in accordance with this embodiment described above, for example, as illustrated in FIG. 21, the detection sections 1007 and 1008 are provided in close proximity to the first substrate 1001 and the second substrate 1002, respectively. Thus, positions and heights of the first substrate 1001 and the second substrate 1002 can be measured, and highly accurate alignment or correction on the first substrate 1001 and the second substrate 1002 is possible. In addition, bonding can be controlled even when states of positions, heights, thicknesses, warpage amounts, and the like of the first substrate 1001 and the second substrate 1002 have been varied.

In addition, for example, as illustrated in FIG. 19, the first chuck 1003 suctions the first substrate 1001 only in the suction region 1013. Likewise, the second chuck 1004 suctions the second substrate 1002 only in the suction region 1023. Thus, the external force to deform the first substrate 1001 and the second substrate 1002 can be small and distortions or misalignments of the first substrate 1001 and the second substrate 1002 can be reduced. In addition, because both a contact area between the first chuck 1003 and the first substrate 1001 and a contact area between the second chuck 1004 and the second substrate 1002 are small, it is possible to prevent the occurrence of distortions or misalignments of the first substrate 1001 and the second substrate 1002 due to the introduction of foreign matters.

In addition, for example, as illustrated in FIG. 19, the area of the suction region 1013 is configured to be wider than the area of the suction region 1023 so that an error relating to conveyance of the first substrate 1001 and the second substrate 1002 or an error of positioning during pre-alignment of the first substrate 1001 and the second substrate 1002 are absorbed. Thus, it is possible to remove conveyance errors of the first substrate 1001 and the second substrate 1002 or an influence of positioning (for example, a diameter of about ±150 μm) during pre-alignment of the first substrate 1001 and the second substrate 1002.

In addition, for example, as illustrated in FIG. 19, in a region other than the suction region 1013, the first substrate 1001 is not in contact with the first chuck 1003, that is, is not subjected to the external force from the first chuck 1003. Thus, when the suction by the first chuck 1003 has been released, the first substrate 1001 attempting to return to an original warpage is subjected to the external force from the first chuck 1003 and hence it is possible to prevent the distortion or misalignment from occurring. The same is also true for the second substrate 1002.

In addition, as illustrated in FIG. 19, warpages of the first substrate 1001 and the second substrate 1002 are controlled to have warpage amounts in which the region 14 on the opposite side of the suction region 1013 and the region 1024 on the opposite side of the suction region 1023 are initially in contact during bonding. Thus, it is possible to control the distortions of the first substrate 1001 and the second substrate 1002 or the occurrence of a void according to bonding. In particular, when the warpage amounts of two wafers are about the same, magnification deviations of the first substrate 1001 and the second substrate 1002 can also be controlled.

In addition, for example, as illustrated in FIGS. 18A and 18B, the joining force between the wafers can be varied by lengthening a plasma activation time before bonding when the warpage amount of one wafer is large. Thereby, bonding capable of reducing the distortion of the wafer, the misalignment during the bonding, and the occurrence of a void is possible.

Also, the problem intended to be solved by the present technology is solved. As described above, it is difficult for the bonding methods of the related art to effectively solve all of the misalignment of bonding of two wafers, the distortion or deformation of the two wafers, and the occurrence of a void during the bonding.

Here, for example, the methods illustrated in the above-described Japanese Unexamined Patent Application Publication No. 2009-49066 and Japanese Unexamined Patent Application Publication No. 2010-135836 can control the misalignment of bonding, but have a problem in that the deformation or distortion of a wafer and the occurrence of a void due to a loading pin opening portion provided in a chuck or foreign matters is not solved.

This problem can be solved, for example, using the methods described in the above-described Japanese Unexamined Patent Application Publication No. H07-066093 and Japanese Unexamined Patent Application Publication No. H07-94675. However, when bonding progresses at a high speed of several centimeters per second (cm/sec) or more, it is difficult to control a suction time of a chuck because of a change in a progress state of bonding due to a subtle change in a wafer surface or the like. In addition, it is difficult to sense a progress state of bonding in an infrared camera or the like according to the method described in Japanese Unexamined Patent Application Publication No. H02-267951 because of a structure portion such as a chuck. In addition, it is substantially difficult to configure all of a complex mechanical structure such as a vacuum chuck or a wafer alignment mechanism using a material that transmits infrared rays.

In addition, in the method disclosed in the above-described Japanese Unexamined Patent Application Publication No. 2011-205074, it is difficult to implement a very high accuracy of a bonding position necessary for a laminated back-surface illuminated sensor even when an accuracy of a bonding position necessary for manufacturing a silicon on insulator (SOI) wafer is implemented. This is because positioning of two wafers is performed using only a notch or orientation flat and a change in positions of two wafers due to wafer movement according to pressing is not considered.

In addition, because the wafer is deformed according to a warpage of the wafer when the suction state of the wafer for the chuck is released, this results in the distortion or misalignment of the wafer.

Figure 30B:
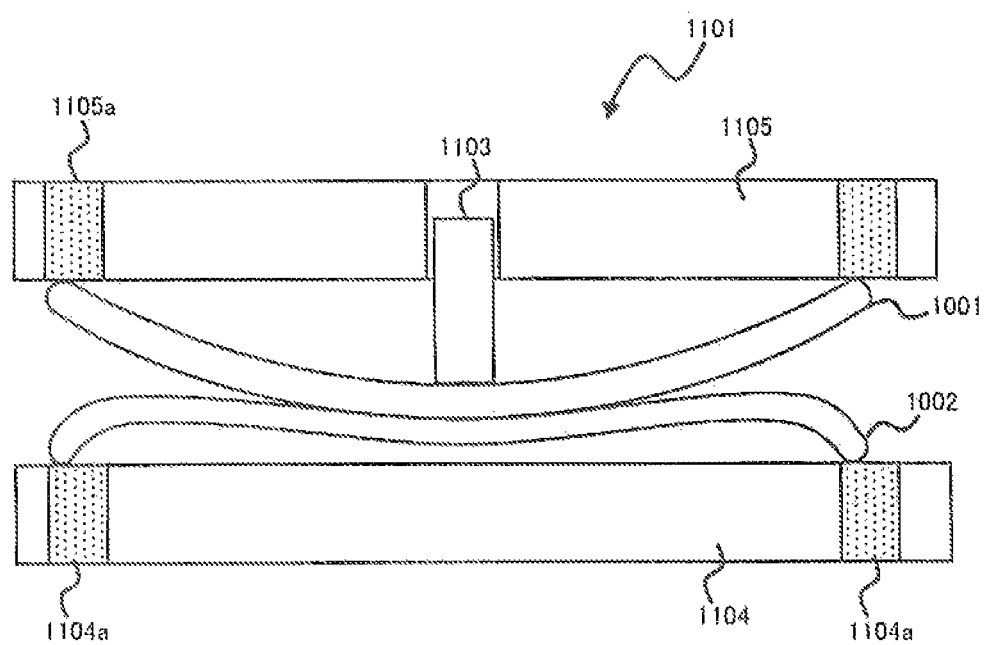
FIG. 30B is an explanatory diagram of deformation of a wafer in accordance with a reference example.

FIGS. 30A and 30B are explanatory diagrams of deformation of a wafer in accordance with a reference example. A manufacturing apparatus 1101 illustrated in FIG. 30A includes an upper chuck 1105 (substrate driving section), a lower chuck 1104, and a pressing member 1103.

The upper chuck 1105 is a plate-like member that detachably holds the first substrate 1001. In the vicinity of the outer circumference of the upper chuck 1105, a suction opening 1105a for vacuum suction of the first substrate 1001 is provided. Further, in the vicinity of the center of the upper chuck 1105, a load application section for causing the pressing member 1103 to be movable in a thickness direction of the upper chuck 1105 is provided.

The lower chuck 1104 is a plate-like member that detachably holds the second substrate 1002. In the vicinity of the outer circumference of the lower chuck 1104, a suction opening 1104a for vacuum suction of the second substrate 1002 is provided.

Here, when a high load is applied by the pressing member 1103 to the first substrate 1001, a load application region of the first substrate 1001 is deformed to be in contact with the second substrate 1002. Thereafter, when the suction state by the suction openings 1105a and 1104a is released, both the first substrate 1001 and the second substrate 1002 are deformed to return to initial warpage amounts as illustrated in FIG. 30B.

As described above, the first substrate 1001 and the second substrate 1002 are deformed according to their own warpages. Therefore, the deformation leads to the distortion or misalignment of the first substrate 1001 and the second substrate 1002.

According to the apparatus for manufacturing the semiconductor device and the method of manufacturing the semiconductor device in accordance with the present technology, it is possible to solve the above-described problems and to effectively prevent the misalignment of bonding of two wafers, the distortion or deformation of the two wafers, and the occurrence of a void during bonding when the two wafers are bonded.

8. Eighth Embodiment

Electronic Device

Figure 31:
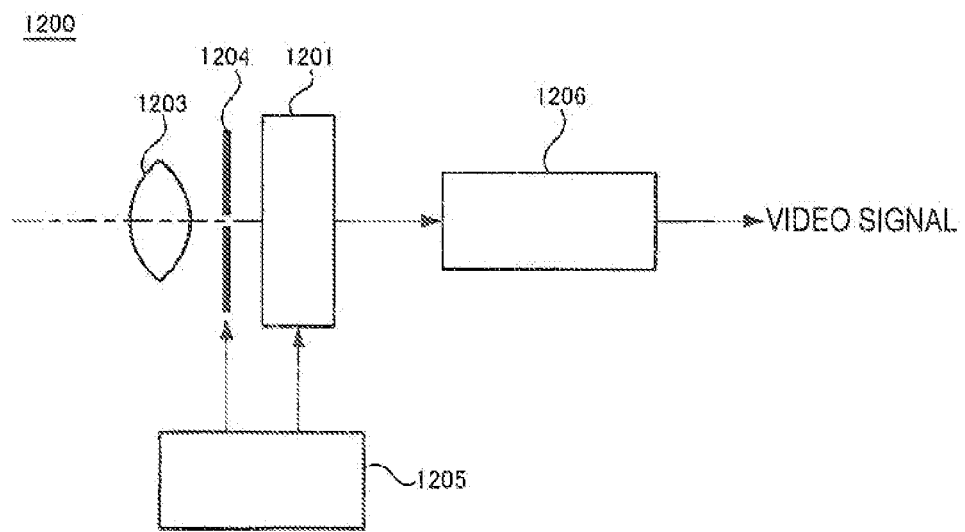
FIG. 31 is a schematic configuration diagram of an electronic device in accordance with an eighth embodiment of the present disclosure.

Next, the electronic device in accordance with the eighth embodiment of the present disclosure will be described. FIG. 31 is a schematic configuration diagram of the electronic device 1200 in accordance with the eighth embodiment of the present disclosure.

The electronic device 1200 in accordance with this embodiment includes a solid-state imaging device 1201, an optical lens 1203, a shutter device 1204, a driving circuit 1205, and a signal processing circuit 1206. In the electronic device 1200 of this embodiment, an embodiment when the solid-state imaging device 1 in the above-described first embodiment of the present disclosure as the solid-state imaging device 1201 is used in an electronic device (a digital still camera) is shown.

The optical lens 1203 collects image light (incident light) from a subject and forms an image on an imaging surface of the solid-state imaging device 1201. Thereby, electric charges per given time are accumulated within the solid-state imaging device 1201. The shutter device 1204 controls a light illuminating time and a light shielding time for the solid-state imaging device 1201. The driving circuit 1205 supplies a driving signal for controlling a signal transfer operation of the solid-state imaging device 1201 and a shutter operation of the shutter device 1204. According to the driving signal (timing signal) supplied from the driving circuit 1205, the solid-state imaging device 1201 transfers a signal. The signal processing circuit 1206 performs various signal processing on the signal output from the solid-state imaging device 1201. A video signal subjected to signal processing is stored in a storage medium such as a memory or output to a monitor.

Because light focusing characteristics and sensitivity characteristics are improved in the solid-state imaging device 1201 in the electronic device 1200 of this embodiment, image quality is improved.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to those disclosed in Japanese Priority Patent Application JP 2012-084014 filed in the Japan Patent Office on Apr. 2, 2012, and in Japanese Priority Patent Application JP 2012-135092 filed in the Japan Patent Office on Jun. 14, 2012, the entire contents of which are hereby incorporated by reference.

What is claimed is:

1. A solid-state imaging device comprising:
a sensor substrate having a sensor-side semiconductor layer including a pixel region in which a photoelectric conversion section is provided and a sensor-side wiring layer provided on an opposite surface side from a light receiving surface of the sensor-side semiconductor layer;
a circuit substrate having a circuit-side semiconductor layer and a circuit-side wiring layer and provided on a side of the sensor-side wiring layer of the sensor substrate;
a connection unit region in which a connection section is provided, the connection section having a first through electrode provided to reach from a light receiving surface side of the sensor-side semiconductor layer to the sensor-side wiring layer, a second through electrode provided to reach from the light receiving surface side of the sensor-side semiconductor layer to the circuit-side wiring layer, and a connection electrode provided on a surface of the light receiving surface side of the sensor-side semiconductor layer and connecting the first through electrode and the second through electrode; and
an insulating layer having a step portion which has the connection electrode embedded therein and has a film thickness that gradually decreases from the connection unit region to the pixel region.

2. The solid-state imaging device according to claim 1, wherein (a) the step portion is provided in a manner such that the insulating layer gradually thins from the connection unit region to a region adjacent to the connection unit region, and (b) the connection unit region is provided with a convex portion.

3. The solid-state imaging device according to claim 2, wherein a plurality of the connection unit regions are provided, and
wherein each connection unit region is arranged along a predetermined side corresponding to the pixel region of a division.

4. The solid-state imaging device according to claim 3, wherein the step portion is provided at a position that encloses the connection unit region.

5. The solid-state imaging device according to claim 4, wherein a planar shape of the convex portion is a rectangular shape with rounded corners and extending in a direction along a side corresponding to the pixel region.

6. The solid-state imaging device according to claim 5, wherein the insulating layer has a laminated structure formed of different materials, and
wherein a film constituting an upper-layer portion of the laminated structure is removed from the insulating layer in a lower portion of the step portion.

7. A method of manufacturing a solid-state imaging device, comprising:
bonding a sensor substrate having a sensor-side semiconductor layer including a pixel region in which a photoelectric conversion section is provided and a sensor-side wiring layer provided on an opposite surface side from a light receiving surface of the sensor-side semiconductor layer with a circuit-side semiconductor layer and a circuit-side wiring layer in a manner such that a surface of the sensor-side wiring layer faces a surface of the circuit-side wiring layer;
forming an insulating layer on a light receiving surface side of the sensor substrate;
forming a connection section in a connection unit region outside the pixel region, the connection section having a first through electrode provided to reach from a surface of the insulating layer to the sensor-side wiring layer, a second through electrode provided to reach from the surface of the insulating layer to the circuit-side wiring layer, and a connection electrode provided on the surface of the insulating layer and connecting the first through electrode and the second through electrode; and
etching the insulating layer to a predetermined depth in a manner that a film thickness gradually thins from the connection unit region to the pixel region.

8. An electronic device comprising:
a solid-state imaging device; and
a signal processing circuit configured to process an output signal output from the solid-state imaging device,
wherein the solid-state imaging device includes
- a sensor substrate having a sensor-side semiconductor layer including a pixel region in which a photoelectric conversion section is provided and a sensor-side wiring layer provided on an opposite surface side from a light receiving surface of the sensor-side semiconductor layer,
- a circuit substrate having a circuit-side semiconductor layer and a circuit-side wiring layer and provided on a side of the sensor-side wiring layer of the sensor substrate,
- a connection unit region in which a connection section is provided, the connection section having a first through electrode provided to reach from a light receiving surface side of the sensor-side semiconductor layer to the sensor-side wiring layer, a second through electrode provided to reach from the light receiving surface side of the sensor-side semiconductor layer to the circuit-side wiring layer, and a connection electrode provided on a surface of the light receiving surface side of the sensor-side semiconductor layer and connecting the first through electrode and the second through electrode, and
- an insulating layer having a step portion which has the connection electrode embedded therein and has a film thickness that gradually decreases from the connection unit region to the pixel region.

* * * * *